(12) United States Patent
Lister et al.

(10) Patent No.: US 10,981,411 B2
(45) Date of Patent: Apr. 20, 2021

(54) SECURITY DEVICES AND METHODS OF MANUFACTURE THEREOF

(71) Applicant: DE LA RUE INTERNATIONAL LIMITED, Basingstoke (GB)

(72) Inventors: Adam Lister, Andover (GB); Brian William Holmes, Fleet (GB)

(73) Assignee: DE LA RUE INTERNATIONAL LIMITED, Hampshire (GB)

( * ) Notice: Subject to any disclaimer, the term of this patent is extended or adjusted under 35 U.S.C. 154(b) by 393 days.

(21) Appl. No.: 15/578,317

(22) PCT Filed: Jun. 9, 2016

(86) PCT No.: PCT/GB2016/051709
§ 371 (c)(1),
(2) Date: Nov. 30, 2017

(87) PCT Pub. No.: WO2016/198876
PCT Pub. Date: Dec. 15, 2016

(65) Prior Publication Data
US 2018/0154677 A1   Jun. 7, 2018

(30) Foreign Application Priority Data

Jun. 10, 2015 (GB) .................................... 1510073

(51) Int. Cl.
*B42D 25/445* (2014.01)
*B42D 25/342* (2014.01)
(Continued)

(52) U.S. Cl.
CPC ......... *B42D 25/445* (2014.10); *B42D 25/342* (2014.10); *B42D 25/373* (2014.10);
(Continued)

(58) Field of Classification Search
CPC .... B42D 25/29; B42D 25/342; B42D 25/373; B42D 25/378; B42D 25/41; B42D 25/435;
(Continued)

(56) References Cited

U.S. PATENT DOCUMENTS

| | | | |
|---|---|---|---|
| 4,892,336 A | 1/1990 | Kaule et al. | |
| 5,186,787 A | 2/1993 | Phillips et al. | |

(Continued)

FOREIGN PATENT DOCUMENTS

| | | | |
|---|---|---|---|
| CA | 2774819 A1 | 4/2011 | |
| DE | 102013106827 A1 | 12/2014 | |

(Continued)

OTHER PUBLICATIONS

Aug. 4, 2017 Examination Report issued in British Patent Application No. GB1510073.8.

(Continued)

*Primary Examiner* — John A McPherson
(74) *Attorney, Agent, or Firm* — Oliff PLC

(57) ABSTRACT

A method of manufacturing an image element array for a security device is disclosed. The method comprises: (a) providing a metallised substrate web comprising a substrate having a first metal layer thereon on a first surface of the substrate, the first metal layer being soluble in a first etchant substance; (b) applying a first photosensitive resist layer to the first metal layer; (c) exposing the first photosensitive resist layer to radiation of a wavelength to which the resist layer is responsive through a patterned mask, by conveying the substrate web along a transport path and, during the exposure, moving the patterned mask alongside the substrate web along at least a portion of the transport path at substantially the same speed as the substrate web, such that there is substantially no relative movement between the (Continued)

mask and the substrate web, wherein the patterned mask comprises first pattern elements in which the mask is substantially opaque to the radiation and second pattern elements in which the mask is substantially transparent to the radiation, whereupon the exposed second pattern elements of the first photosensitive resist layer react resulting in increased solubility by a second etchant substance, the non-exposed first pattern elements remaining relatively insoluble by the second etchant substance; and (d) applying the first and second etchant substances to the substrate web whereupon the second pattern elements of both the first resist layer and the first metal layer are dissolved, the remaining first pattern elements of the first metal layer forming an image element array.

18 Claims, 16 Drawing Sheets

(51) Int. Cl.

| | | |
|---|---|---|
| B42D 25/373 | (2014.01) | |
| B42D 25/378 | (2014.01) | |
| G02B 3/00 | (2006.01) | |
| G02B 27/60 | (2006.01) | |
| G03F 7/022 | (2006.01) | |
| G03F 7/039 | (2006.01) | |
| G03F 7/16 | (2006.01) | |
| G03F 7/20 | (2006.01) | |
| G03F 7/32 | (2006.01) | |
| B42D 25/324 | (2014.01) | |
| B42D 25/328 | (2014.01) | |

(52) U.S. Cl.
CPC ......... *B42D 25/378* (2014.10); *G02B 3/005* (2013.01); *G02B 27/60* (2013.01); *G03F 7/022* (2013.01); *G03F 7/039* (2013.01); *G03F 7/16* (2013.01); *G03F 7/2002* (2013.01); *G03F 7/327* (2013.01); *B42D 25/324* (2014.10); *B42D 25/328* (2014.10)

(58) Field of Classification Search
CPC .. B42D 25/445; B42D 25/324; B42D 25/328; G02B 27/60; G02B 3/005; G03F 7/039; G03F 7/2002
USPC .............................................. 283/85, 87, 94
See application file for complete search history.

(56) References Cited

U.S. PATENT DOCUMENTS

| | | | |
|---|---|---|---|
| 6,856,462 | B1 | 2/2005 | Scarbrough et al. |
| 2010/0277805 | A1 | 11/2010 | Schilling et al. |
| 2013/0056971 | A1* | 3/2013 | Holmes ................ B42D 25/351 |
| | | | 283/74 |
| 2014/0227488 | A1 | 8/2014 | Brehm et al. |
| 2016/0185150 | A1 | 6/2016 | Brehm et al. |

FOREIGN PATENT DOCUMENTS

| | | |
|---|---|---|
| EP | 0 059 056 A1 | 9/1982 |
| EP | 0 860 298 A2 | 8/1998 |
| EP | 0987599 A2 | 3/2000 |
| EP | 1 398 174 A1 | 3/2004 |
| GB | 2495628 A | 4/2013 |
| GB | 2517079 A | 2/2015 |
| GB | 2518286 A | 3/2015 |
| WO | 83/00659 A1 | 3/1983 |
| WO | 94/27254 A1 | 11/1994 |
| WO | 95/10419 A1 | 4/1995 |
| WO | 95/010420 A1 | 4/1995 |
| WO | 00/09391 A1 | 2/2000 |
| WO | 00/39391 A1 | 7/2000 |
| WO | 03/054297 A2 | 7/2003 |
| WO | 03/091952 A2 | 11/2003 |
| WO | 03/091953 A2 | 11/2003 |
| WO | 03/095188 A2 | 11/2003 |
| WO | 2005/052650 A2 | 6/2005 |
| WO | 2006/125224 A2 | 11/2006 |
| WO | 2011/051669 A1 | 5/2011 |
| WO | 2011/051670 A2 | 5/2011 |
| WO | 2011/107782 A1 | 9/2011 |
| WO | 2011/107783 A1 | 9/2011 |
| WO | 2012/027779 A1 | 3/2012 |
| WO | 2013/156149 A1 | 10/2013 |
| WO | 2014/177267 A1 | 11/2014 |

OTHER PUBLICATIONS

Dec. 11, 2015 Combined Search and Examination Report issued in British Patent Application No. GB1510073.8.
Oct. 13, 2016 Search Report issued in British Patent Application No. GB1510073.8.
Aug. 3, 2017 Combined Search and Examination Report issued in British Patent Application No. GB1709038.2.
Oct. 6, 2016 Written Opinion issued in Patent Application No. PCT/GB2016/051709.
Oct. 6, 2016 International Search Report issued in Patent Application No. PCT/GB2016/051709.

\* cited by examiner

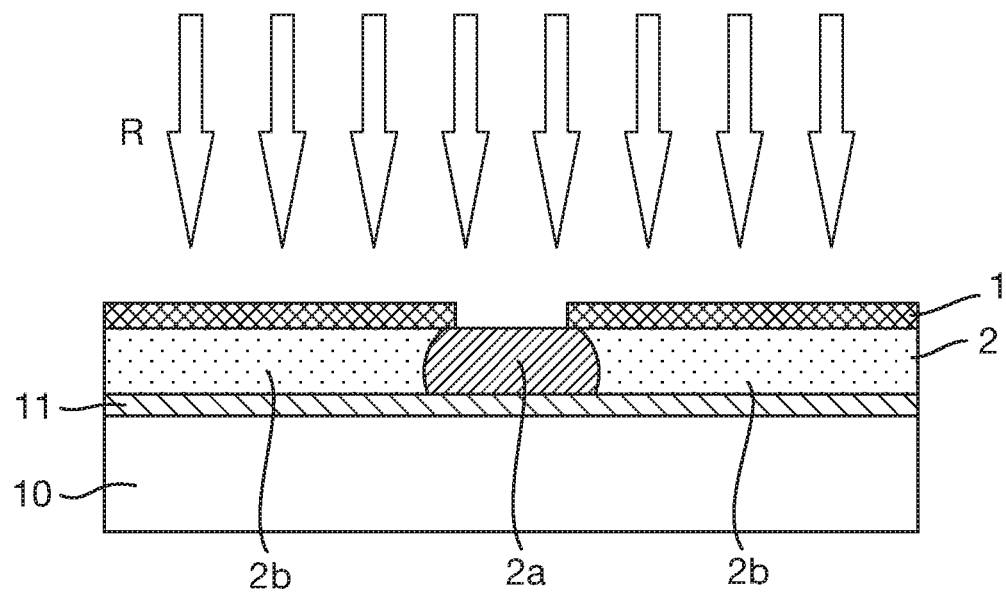
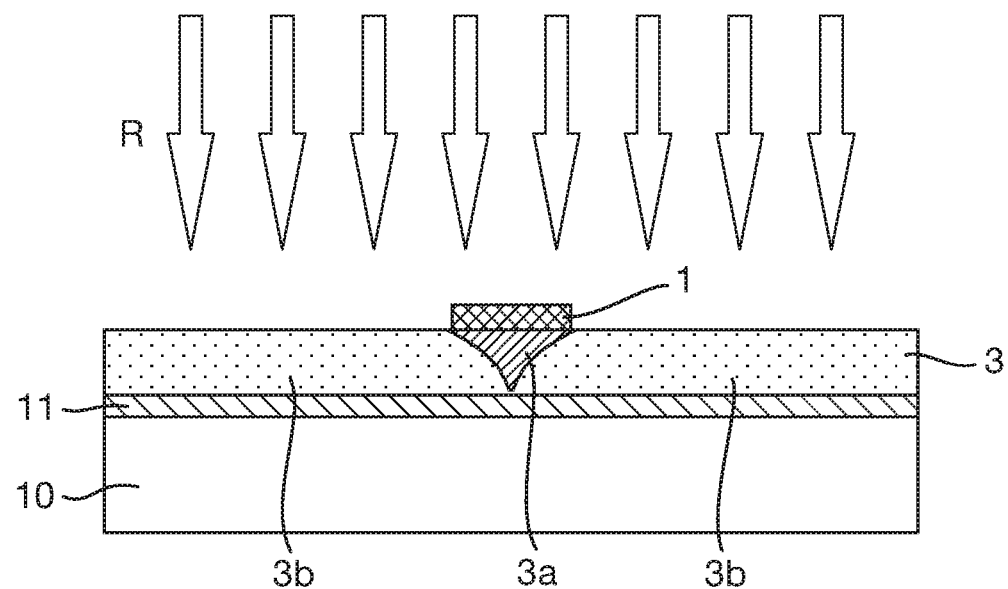

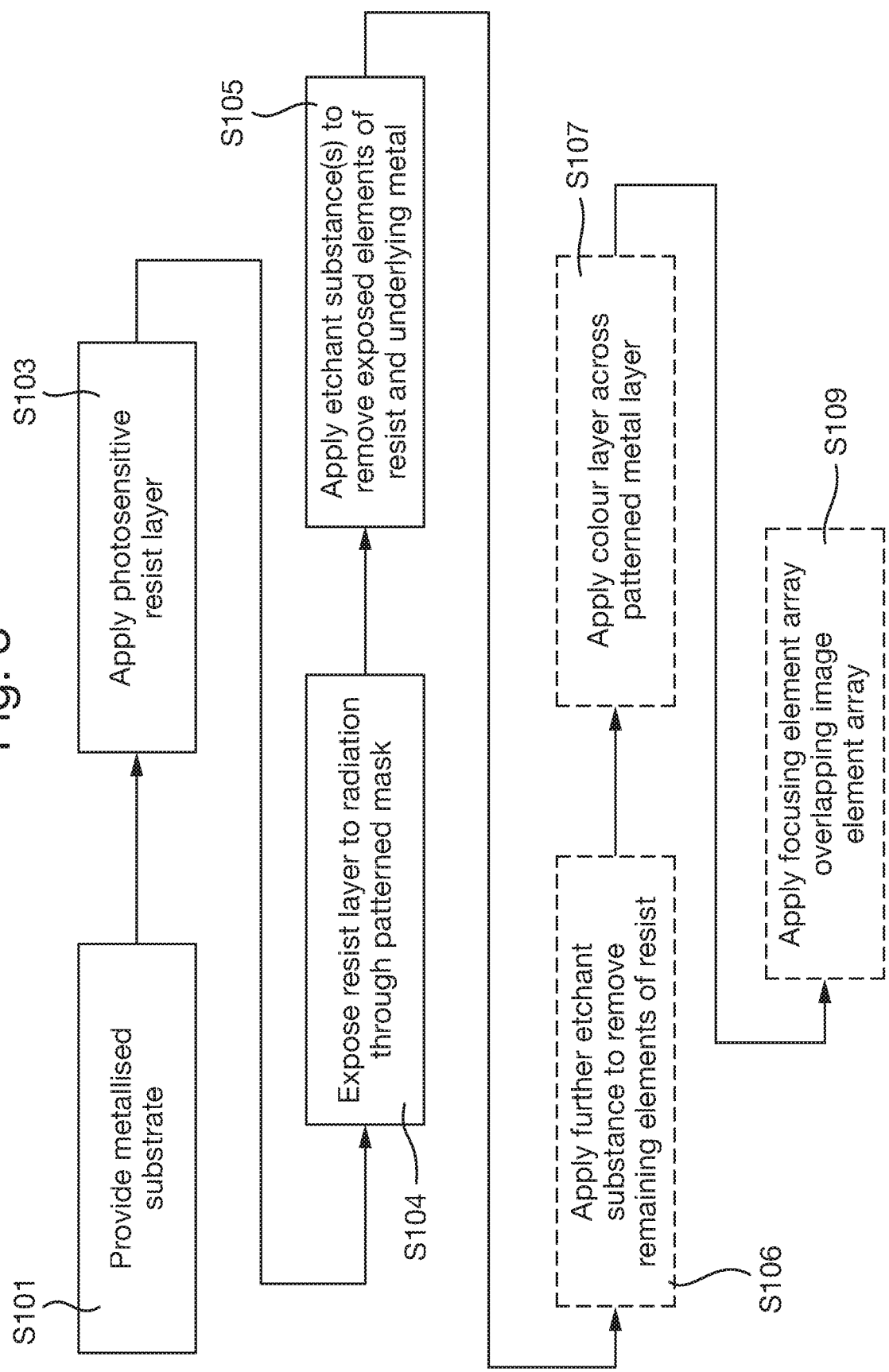

SECURITY DEVICES AND METHODS OF MANUFACTURE THEREOF

This invention relates to image element arrays for use in security devices, as well as to security devices themselves. Security devices are used for example on documents of value such as banknotes, cheques, passports, identity cards, certificates of authenticity, fiscal stamps and other secure documents, in order to confirm their authenticity. Methods of manufacturing image element arrays and security devices are also disclosed.

Articles of value, and particularly documents of value such as banknotes, cheques, passports, identification documents, certificates and licences, are frequently the target of counterfeiters and persons wishing to make fraudulent copies thereof and/or changes to any data contained therein. Typically such objects are provided with a number of visible security devices for checking the authenticity of the object. By "security device" we mean a feature which it is not possible to reproduce accurately by taking a visible light copy, e.g. through the use of standardly available photocopying or scanning equipment. Examples include features based on one or more patterns such as microtext, fine line patterns, latent images, venetian blind devices, lenticular devices, moiré interference devices and moiré magnification devices, each of which generates a secure visual effect. Other known security devices include holograms, watermarks, embossings, perforations and the use of colour-shifting or luminescent/fluorescent inks. Common to all such devices is that the visual effect exhibited by the device is extremely difficult, or impossible, to copy using available reproduction techniques such as photocopying. Security devices exhibiting non-visible effects such as magnetic materials may also be employed.

One class of security devices are those which produce an optically variable effect, meaning that the appearance of the device is different at different angles of view. Such devices are particularly effective since direct copies (e.g. photocopies) will not produce the optically variable effect and hence can be readily distinguished from genuine devices. Optically variable effects can be generated based on various different mechanisms, including holograms and other diffractive devices, moiré interference and other mechanisms relying on parallax such as venetian blind devices, and also devices which make use of focusing elements such as lenses, including moiré magnifier devices, integral imaging devices and so-called lenticular devices.

Moiré magnifier devices (examples of which are described in EP-A-1695121, WO-A-94/27254, WO-A-2011/107782 and WO2011/107783) make use of an array of focusing elements (such as lenses or mirrors) and a corresponding array of microimages, wherein the pitches of the focusing elements and the array of microimages and/or their relative locations are mismatched with the array of focusing elements such that a magnified version of the microimages is generated due to the moiré effect. Each microimage is a complete, miniature version of the image which is ultimately observed, and the array of focusing elements acts to select and magnify a small portion of each underlying microimage, which portions are combined by the human eye such that the whole, magnified image is visualised. This mechanism is sometimes referred to as "synthetic magnification". The magnified array appears to move relative to the device upon tilting and can be configured to appear above or below the surface of the device itself. The degree of magnification depends, inter alia, on the degree of pitch mismatch and/or angular mismatch between the focusing element array and the microimage array.

Integral imaging devices are similar to moiré magnifier devices in that an array of microimages is provided under a corresponding array of lenses, each microimage being a miniature version of the image to be displayed. However here there is no mismatch between the lenses and the microimages. Instead a visual effect is created by arranging for each microimage to be a view of the same object but from a different viewpoint. When the device is tilted, different ones of the images are magnified by the lenses such that the impression of a three-dimensional image is given.

"Hybrid" devices also exist which combine features of moiré magnification devices with those of integral imaging devices. In a "pure" moiré magnification device, the microimages forming the array will generally be identical to one another. Likewise in a "pure" integral imaging device there will be no mismatch between the arrays, as described above. A "hybrid" moiré magnification/integral imaging device utilises an array of microimages which differ slightly from one another, showing different views of an object, as in an integral imaging device. However, as in a moiré magnification device there is a mismatch between the focusing element array and the microimage array, resulting in a synthetically magnified version of the microimage array, due to the moiré effect, the magnified microimages having a three-dimensional appearance. Since the visual effect is a result of the moiré effect, such hybrid devices are considered a subset of moiré magnification devices for the purposes of the present disclosure. In general, therefore, the microimages provided in a moiré magnification device should be substantially identical in the sense that they are either exactly the same as one another (pure moiré magnifiers) or show the same object/scene but from different viewpoints (hybrid devices).

Moiré magnifiers, integral imaging devices and hybrid devices can all be configured to operate in just one dimension (e.g. utilising cylindrical lenses) or in two dimensions (e.g. comprising a 2D array of spherical or aspherical lenses).

Lenticular devices on the other hand do not rely upon magnification, synthetic or otherwise. An array of focusing elements, typically cylindrical lenses, overlies a corresponding array of image sections, or "slices", each of which depicts only a portion of an image which is to be displayed. Image slices from two or more different images are interleaved and, when viewed through the focusing elements, at each viewing angle, only selected image slices will be directed towards the viewer. In this way, different composite images can be viewed at different angles. However it should be appreciated that no magnification typically takes place and the resulting image which is observed will be of substantially the same size as that to which the underlying image slices are formed. Some examples of lenticular devices are described in U.S. Pat. No. 4,892,336, WO-A-2011/051669, WO-A-2011051670, WO-A-2012/027779 and U.S. Pat. No. 6,856,462. More recently, two-dimensional lenticular devices have also been developed and examples of these are disclosed in British patent application numbers 1313362.4 and 1313363.2. Lenticular devices have the advantage that different images can be displayed at different viewing angles, giving rise to the possibility of animation and other striking visual effects which are not possible using the moiré magnifier or integral imaging techniques.

Security devices such as moiré magnifiers, integral imaging devices and lenticular devices, as well as others such as venetian blind type devices (which utilise a masking grid in place of focusing elements) and moiré interference devices depend for their success significantly on the resolution with which the image array (defining for example microimages, interleaved image sections or line patterns) can be formed. Since the security device must be thin in order to be incorporated into a document such as a banknote, any focusing elements required must also be thin, which by their nature also limits their lateral dimensions. For example, lenses used in such security elements preferably have a width or diameter of 50 microns or less, e.g. 30 microns. In a lenticular device this leads to the requirement that each image element must have a width which is at most half the lens width. For example, in a "two channel" lenticular switch device which displays only two images (one across a first range of viewing angles and the other across the remaining viewing angles), where the lenses are of 30 micron width, each image section must have a width of 15 microns or less. More complicated lenticular effects such as animation, motion or 3D effects usually require more than two interlaced images and hence each section needs to be even finer in order to fit all of the image sections into the optical footprint of each lens. For instance, in a "six channel" device with six interlaced images, where the lenses are of 30 micron width, each image section must have a width of 5 microns or less.

Similarly high-resolution image elements are also required in moiré magnifiers and integral imaging devices since approximately one microimage must be provided for each focusing element and again this means in effect that each microimage must be formed within a small area of e.g. 30 by 30 microns. In order for the microimage to carry any detail, fine linewidths of 5 microns or less are therefore highly desirable.

The same is true for many security devices which do not make use of focusing elements, e.g. venetian blind devices and moiré interference devices which rely on the parallax effect caused when two sets of elements on different planes are viewed in combination from different angles. In order to perceive a change in visual appearance upon tilting over acceptable angles, the aspect ratio of the spacing between the planes (which is limited by the thickness of the device) to the spacing between image elements must be high. This in practice requires the image elements to be formed at high resolution to avoid the need for an overly thick device.

Typical processes used to manufacture image elements for security devices are based on printing and include intaglio, gravure, wet lithographic printing as well as dry lithographic printing. The achievable resolution is limited by several factors, including the viscosity, wettability and chemistry of the ink, as well as the surface energy, unevenness and wicking ability of the substrate, all of which lead to ink spreading. With careful design and implementation, such techniques can be used to print pattern elements with a line width of between 25 µm and 50 µm. For example, with gravure or wet lithographic printing it is possible to achieve line widths down to about 15 µm.

Methods such as these are limited to the formation of single-colour image elements, since it is not possible to achieve the high registration required between different workings of a multi-coloured print. In the case of a lenticular device for example, the various interlaced image sections must all be defined on a single print master (e.g. a gravure or lithographic cylinder) and transferred to the substrate in a single working, hence in a single colour. The various images displayed by the resulting security device will therefore be monotone, or at most duotone if the so-formed image elements are placed against a background of a different colour.

One approach which has been put forward as an alternative to the printing techniques mentioned above is used in the so-called Unison Motion™ product by Nanoventions Holdings LLC, as mentioned for example in WO-A-2005052650. This involves creating pattern elements ("icon elements") as recesses in a substrate surface before spreading ink over the surface and then scraping off excess ink with a doctor blade. The resulting inked recesses can be produced with line widths of the order of 2 µm to 3 µm. This high resolution produces a very good visual effect, but the process is complex and expensive. Further, limits are placed on the minimum substrate thickness by the requirement to carry recesses in its surface. Again, this technique is only suitable for producing image elements of a single colour.

Alternative methods for producing such high resolution image elements would be highly desirable.

A first aspect of the present invention provides a method of manufacturing an image element array for a security device, comprising:
(a) providing a metallised substrate web comprising a substrate having a first metal layer thereon on a first surface of the substrate, the first metal layer being soluble in a first etchant substance;
(b) applying a first photosensitive resist layer to the first metal layer;
(c) exposing the first photosensitive resist layer to radiation of a wavelength to which the resist layer is responsive through a patterned mask, by conveying the substrate web along a transport path and, during the exposure, moving the patterned mask alongside the substrate web along at least a portion of the transport path at substantially the same speed as the substrate web, such that there is substantially no relative movement between the mask and the substrate web, wherein the patterned mask comprises first pattern elements in which the mask is substantially opaque to the radiation and second pattern elements in which the mask is substantially transparent to the radiation, whereupon the exposed second pattern elements of the first photosensitive resist layer react resulting in increased solubility by a second etchant substance, the non-exposed first pattern elements remaining relatively insoluble by the second etchant substance; and
(d) applying the first and second etchant substances to the substrate web whereupon the second pattern elements of both the first resist layer and the first metal layer are dissolved, the remaining first pattern elements of the first metal layer forming an image element array.

As a preliminary point it should be noted that the first metal layer need not be in direct contact with the first surface of the substrate. In some examples one or more layers, such as a primer layer, may exist between the substrate and the first metal layer. Further examples will be given below. The first metal layer also need not be disposed all over the substrate provided in step (a), although this will be the case in many preferred examples, but may be present only across selected portions thereof (of a scale larger than that of the pattern). The substrate web could be of a sort suitable for forming a security article such as a security thread, strip or patch or could be of a sort suitable for forming the substrate of a security document itself, such as a polymer banknote substrate.

By defining the pattern by exposure to radiation through a mask, very high resolution and hence fine detail can be achieved since there is no spreading of the pattern elements as is generally encountered in conventional printing techniques. This is particularly the case where the pattern is transferred by etching into a metal layer, since the metal layer can be made very thin (e.g. 50 nm or less) whilst still having a high optical density, with the result that upon etching very little lateral dissolution of the metal layer occurs, which could otherwise reduce the resolution of the pattern. Moreover, by exposing the resist as it is conveyed along the transport path, through a moving mask, the manufacturing method can be performed in a continuous manner rather than sheet-by-sheet or batchwise. The web-based nature of the disclosed method allows for substantially continuous production, with a high speed and high volume output. This ensures the viability of the process for manufacturing large quantities of identical security device components at an acceptable cost. This is vital for a successful security device since the visual effect produced by each device must be consistent in order that authentic devices can be readily distinguished from imitations. Further it becomes possible to produce items such as security threads and strips in the form of a continuous web ready for incorporation into a paper making process for example. Similarly, the process can be applied to a continuous web forming the basis of security documents such as polymer banknotes.

In addition, the use of a resist material which becomes soluble (or more soluble) upon exposure to radiation of the appropriate wavelength, i.e. a "positive" resist material, has been found by the present inventors to achieve a further improvement in resolution as compared with "negative" resist materials which become insoluble (or less soluble) upon exposure to radiation of the appropriate wavelength. This is particularly the case where the pattern to be formed in the metal comprises negative indicia, e.g. demetallised regions forming letters, numbers, patterns, lines, graphics etc., against surroundings of continuous metal.

Depending on the composition of the metal layer and of the resist material, different etchant materials may be required to dissolve each one, in which case step (d) may involve applying the first and second (different) etchants to the substrate web sequentially: removing first the resist material and then the metal from the second pattern elements on the web.

However, in particularly preferred implementations, the second etchant substance is the same as the first etchant substance, and the second pattern elements of both the first resist layer and the first metal layer are soluble in the same first etchant substance. The use of a metal layer and resist material which are both soluble in the same first etchant substance greatly simplifies the processing of the substrate web since the metal layer and resist material can both be removed from the second pattern elements by the same solvent, so that no second etchant is required. Most preferably in step (d) the second pattern elements of the metal layer and of the resist layer are dissolved in a single etching procedure. Achieving removal of both materials in a single processing step speeds up and simplifies the manufacturing procedure.

As alluded to above, exposure of the resist material to the radiation causes the resist material to become "more soluble" in the etchant substance—that is, the unexposed resist may possess a degree of solubility in the same substance. However it is preferable that the unexposed resist material is substantially insoluble in the etchant substance such that a large difference in the solubility of the exposed and unexposed regions of the resist exists, in order to achieve the desired high resolution pattern.

In some preferred embodiments, the first etchant substance is alkaline (caustic), the photosensitive resist comprising a material which becomes soluble in alkaline conditions upon exposure to radiation, preferably ultraviolet radiation, and the first metal layer comprising a metal which is soluble in alkaline conditions, preferably aluminium an aluminium alloy, chromium or a chromium alloy. By "aluminium alloys" we mean alloys in which aluminium is the major component, i.e. at least 50%. Similarly "chromium alloys" comprising at least 50% chromium are meant. Iron and copper can also be etched under alkaline conditions but will dissolve much more slowly than the preferred metals mentioned above. For chromium and chromium alloys, potassium hexacyanoferrate may be added to the etchant to assist the dissolution. Advantageously, the photosensitive resist comprises diazonapthaquinone (DNQ)-based resist material, preferably 1,2-Napthoquinone diazide. Preferably the DNQ substance is the majority component of the solid resist (e.g. making up at least 50% (by weight), more preferably at least 95% (by weight) and in some cases 100% of the solid resist, i.e. after drying). The solid resist may optionally further comprise a binder such as a resin, preferably in minor quantities. In particularly advantageous embodiments the (wet) resist composition may also include a surfactant. The use of a photosensitive resist composition further comprising a surfactant is particularly advantageous since this has been found by the present inventor to assist in forming an even coating of the resist across the substrate, i.e. reducing the variation in the thickness of the resist layer from one point to another. This improves the end result significantly since different resist thickness require different radiation and etching parameters for best results so any variation in the resist thickness will give rise to inconsistencies in the etched pattern, unless complex steps are taken to vary the radiation parameters and/or etch conditions accordingly. Most preferably, a volatile surfactant substance is used such that, upon drying of the resist, the surfactant exits the system as a gas, so as not to interfere with the remaining process steps.

In other preferred embodiments, the first etchant substance is acidic, and the first metal layer comprises a metal which is soluble in acidic conditions, preferably copper, a copper alloy, chromium or a chromium alloy. Again, the term "copper alloy" refers to alloys containing at least 50% copper. The first photosensitive resist layer could comprise a diazonapthaquinone (DNQ)-based resist as before, in which case this will removed in step (d) by an alkaline etchant before using an acidic etchant to dissolve the metal. However, more advantageously, the photosensitive resist comprises a material which becomes soluble in acidic conditions upon exposure to radiation, preferably ultraviolet radiation.

Preferred resist layers have a thickness of less than 1 micron, more preferably between 0.2 and 0.6 microns. Particularly good results have been obtained using a resist coating of approximately 0.35 microns.

The non-exposed elements of the resist could remain in-situ in the finished product. However, to reduce the finished thickness of the structure it is preferable to remove them and therefore the method may preferably further comprise, after step (d):

(e) applying a further etchant substance to the substrate web to dissolve the remaining, non-exposed first pattern elements of the first photosensitive resist layer.

The second etchant substance will be a solvent in which the metal layer is substantially insoluble. Where the resist comprises a diazonapthaquinone (DNQ)-based resist, suitable substances for removing it include methyl ethyl ketone (MEK).

Steps (d) and/or (e) may be performed by immersing the substrate web into a bath of the appropriate etchant substance and/or spraying the etchant substance(s) onto the web, for example. Application of the etchant(s) may be accompanied by mechanical action to assist in dissolution of the materials, e.g. agitation, vibration, brushing, stirring, ultrasonic waves etc.

The image array produced by the above method is suitable for use in a security device but will be of a single colour corresponding to that of the metal layer unless additional steps are taken. Therefore, in particularly preferred embodiments, the method further comprises, providing a colour layer on the first or second surface of the substrate, the colour layer comprising at least one optically detectable substance provided across the first and second pattern elements in at least one zone of the array, such that when viewed from one side of the substrate web, the colour layer is exposed in the second pattern elements between the first pattern elements of the first metal layer.

As detailed further below whilst in most preferred examples the colour layer will exhibit at least one visible colour which is apparent to the naked eye, this is not essential as the optically detectable substance(s) could emit outside the visible spectrum, e.g. being detectable by machine only. In both cases the colour layer provides the optical characteristics exhibited by the image element array in the second pattern elements but since the position, size and shape of those elements have been defined by the metal layer, the colour layer can be applied without the need for a high resolution process, or any registration with the metal layer. The formation of the fine detail in the image array is effectively decoupled from the provision of its colour (or other optical characteristics).

The colour layer can be provided at various different stages of the manufacturing method. If the colour layer is to be carried on the second surface of the substrate (optionally via a primer layer), the colour layer could be applied at any time in the process (i.e. before, during or after any of steps (a) to (d)). For instance if the colour layer is formed before performance of the present method it will be present on the substrate web supplied in step (a). However, preferably the colour layer is located on the first surface of the substrate web so that it is closely adjacent the first metal layer, preferably in contact. In some particularly preferred embodiments, the colour layer is applied after step (d) and, if performed, step (e), on the first surface of the substrate over the remaining portions of the metal layer. In this case the substrate will be transparent and the image element array ultimately viewed through it. In other preferred implementations, the colour layer is provided on the metallised substrate web in step (a) between the first metal layer and the substrate on the first surface of the substrate. In this case the substrate need not be transparent since the image element array will not be viewed through it but from the outside.

The colour layer could cover a single zone of the array (which zone preferably does not extend across the whole array), in which case within the zone the second pattern elements will possess the optical characteristics of the colour layer whereas outside the zone the second pattern elements may be transparent or may ultimately take on the colour of some underlying substrate. Preferably the periphery of the zone defines an image such as indicia (e.g. an alphanumeric character). In this way, further information can be incorporated into the image array in addition to the optical effect that is to be generated by the pattern elements themselves.

Advantageously, the colour layer comprises a plurality of different optically detectable substances provided across the first and second pattern elements in respective laterally offset zones of the array, wherein preferably each zone encompasses a plurality of the first and second pattern elements. In this way the colour (or other optical characteristic) of the second pattern elements will vary across the array, resulting in a multi-coloured effect for example. Since the colour layer does not have to be applied with high resolution, conventional multi-coloured application processes can be used to form the colour layer, e.g. multiple print workings.

The colour layer can therefore take a wide variety of forms depending on the nature of the optical effect that is to be generated. Preferably, the colour layer is configured in the form of an image arising from the arrangement of the zone(s) and/or the shape of the periphery of the zone(s). The image may be highly complex: for example, a full-colour photographic image may be suitable for use in certain lenticular devices (described further below). Alternatively, simpler images such as block colour patterns, optionally defining indicia by way of their outline, are preferred for use in moiré magnifier and integral imaging devices (also described below).

As indicated above, the colour layer may possess one or more conventional visible colours but this is not essential. In preferred examples, the optically detectable substance(s) may comprise any of: visibly coloured dyes or pigments; luminescent, phosphorescent or fluorescent substances which emit in the visible or non-visible spectrum; metallic pigments; interference layer structures and interference layer pigments. The term "visible colour" is used herein to refer to all hues detectable by the human eye, including black, grey, white, silver etc., as well as red, green, blue etc. The colour layer may be formed of one or more inks containing the optically detectable substances, suitable for application by printing for example, or could be applied by other means such as vapour deposition (e.g. as in the case of interference layer structures). Preferably, the colour layer is applied by printing, coating or laminating, optionally in more than one working, preferably by any of: laser printing, inkjet printing, lithographic printing, gravure printing, flexographic printing, letterpress or dye diffusion thermal transfer printing. It should be noted that the colour layer could initially be formed on a separate substrate and then laminated to the substrate on which the patterned metal layer is formed.

The colour layer may have sufficient optical density to provide the desired optical characteristics by itself. However in preferred embodiments the method further comprises applying a substantially opaque backing layer to the substrate, such that the colour layer is located between the first metal layer and the substantially opaque backing layer, the substantially opaque backing layer preferably comprising a further metal layer.

The point in the process at which the backing layer is applied will depend on the location of the colour layer relative to the metal layer. If the colour layer is applied over the demetallised pattern on the first surface of the substrate, the backing layer will be applied after the colour layer on the same surface. If the colour layer is provided under the metal layer on the metallised substrate web, the backing layer may also pre-exist in step (a) under the colour layer.

The substantially opaque backing layer improves the appearance of the image element array by obstructing the transmission of light through the array which may otherwise confuse the final visual effect. A reflective material such as a further metal layer is particularly preferred for use as the backing layer in order to enhance the reflective appearance of the second pattern elements. The substantially opaque backing layer is preferably applied across the whole extent of the array including any regions outside the zone(s) of the colour layer. In such regions, if the backing layer is of substantially the same appearance as the patterned metal layer, the contrast between the first and second pattern elements will be reduced or even eliminated. This may be desirable to limit the final visual effect to those zones where the colour layer is provided.

In many embodiments, the metallic colour and reflective nature of the first pattern elements resulting from the metal layer will be desirable. However, in some cases it may be preferred to modify the appearance of the first pattern elements, e.g. to change their colour and/or to reduce the specular nature of the reflection from the first pattern elements (since this can make the appearance of the image array overly dependent on the nature of the light source(s) present when the finished device is observed). Therefore, in preferred embodiments, in step (a) the metallised substrate web further comprises a filter layer on the first surface, between the transparent substrate and the metal layer, across at least an area of the substrate web. The filter layer will remain at least in the first pattern elements of the finished image array, located between the viewer and the first metal layer, and acts to modify the appearance of the first pattern elements.

If the filter layer is sufficiently translucent, it may be retained across the whole array since any colour layer provided can be viewed through it in the second pattern elements. However, preferably the method further comprises, after step (d), applying a further etchant substance in which the filter layer is more soluble than the metal layer or the resist layer, to thereby remove the portions of the filter layer in the second pattern elements. The metal layer is preferably insoluble in the further etchant substance.

The nature of the filter layer will depend on the desired effect. In preferred cases the filter layer is provided to diffuse the light reflected by the metal layer, thereby improving the light source invariance of the finished device. In this case, the light-diffusing layer preferably comprises at least one colourless or coloured optical scattering material. For example, the light diffusing layer could comprise a scattering pigment dispersed in a binder. This can be used to disguise the metallic construction of the image array and make it have an appearance closer to that of ink. In other cases it may be desirable to retain the metallic appearance but change its colour, in which case the filter layer may comprise a coloured clear material such as a tinted lacquer. This can be used to give one metal the appearance of another, e.g. an aluminium metal layer can be combined with an orange-brown filter layer making the metal layer appear as if it were formed of copper or bronze.

The filter layer could have a uniform appearance across the array so that the first pattern elements all have the same optical characteristics. However, in preferred examples, the filter layer comprises a plurality of different materials arranged in respective laterally offset areas across the array. For instance the layer may be applied in a multi-coloured pattern. This can be used to introduce an additional level of complexity to the final optically variable effect since the first pattern elements will now vary in their optical characteristics. For example, the filter layer may carry a further image.

The filter layer does not need to be of high optical density since the metal layer is substantially opaque. As such the filter layer is desirably thin so as to minimise any undercutting during etching. Preferably, the thickness of the filter layer is equal to or less than the minimum lateral dimension of the first or second pattern elements, preferably half or less. For example, if the pattern includes features having minimum dimensions of 1 micron (e.g. a 1 micron line width), the filter layer preferably has a thickness of 1 micron or less, more preferably 0.5 microns or less.

The first metal layer on the substrate web may be substantially flat resulting in a uniformly reflective appearance. However, to increase the security level still further, the first metal layer may be used to carry additional security features. Preferably, in step (a), the metallised substrate web has an optically variable effect generating relief structure in its first surface, the metal layer conforming to the contours of the relief structure on one or (preferably) both of its sides, wherein the optically variable effect generating relief structure is preferably a diffractive relief structure, most preferably a diffraction grating, a hologram or a kinegram. Such a structure may be limited to an area of the web away from the demetallised image array formed by the method, or may coincide with the array such that at least some of the first pattern elements display the optically variable effect. As already mentioned, in step (a) the metal layer could be provided across the whole surface of the substrate or could be disposed only on selected portions of the substrate, e.g. corresponding to the lateral extent of a desired security device on a security article such as a thread, strip or patch, or on a security document such as a polymer banknote of which the substrate is to form the basis.

The nature of the pattern will depend upon the type of security device the image element array is to form part of. However, typically the pattern of first and second pattern elements includes pattern elements with a minimum dimension of 50 microns or less, preferably 30 microns or less, more preferably 20 microns or less, still preferably 10 microns or less, most preferably 5 microns or less.

In preferred examples, the pattern of first and second pattern elements is periodic in at least a first dimension and either the first pattern elements are substantially identical to one another and/or the second pattern elements are substantially identical to one another. This will be suitable for use in moiré magnification devices (including hybrid devices), integral imaging devices and certain types of lenticular device. As discussed previously, by "substantially identical" we include microimages which depict the same object or scene as of another but from different angles of view.

In some preferred embodiments, each first pattern element defines a microimage, preferably one or more letters, numbers, logos or other symbols, the microimages being substantially identical to one another, and the second pattern elements define a background surrounding the microimages, or vice versa. Such patterns are well adapted for use in moiré magnification devices (including hybrid devices) and integral imaging devices. Preferably, the microimages are arranged in a grid pattern, periodic in a first dimension and in a second dimension, wherein the grid pattern is preferably arranged on an orthogonal or hexagonal grid. In order that the image array can be utilised in a security device of desirably small thickness, each microimage preferably occupies an area having a size of 50 microns or less in at least one dimension, preferably 30 microns or less, most preferably 20 microns or less. In order to display detail within the microimages, each microimage preferably has a line width of 10 microns or less, preferably 5 microns or less, most preferably 3 microns or less.

In other preferred embodiments, the first pattern elements may themselves constitute one "channel" of a lenticular device with the second pattern elements providing a second "channel", as will be described further below. The lenticular device may be active in one dimension or two. In the former case, the pattern of first and second pattern elements is preferably a line pattern, periodic in the first dimension which is perpendicular to the direction of the lines, the line pattern preferably being of straight parallel lines, and the width of the lines preferably being substantially equal to the spacing between the lines. In the latter case, the pattern of first and second pattern elements is preferably a grid pattern, periodic in the first dimension and in a second dimension, wherein the grid pattern is preferably arranged on an orthogonal or hexagonal grid, the grid pattern preferably being of dots arranged according to the grid, most preferably square, rectangular, circular or polygonal dots. The grid pattern may preferably constitute a checkerboard pattern for example.

For other lenticular devices, the image array may be more complex. For instance, the first pattern elements can be configured to provide parts of multiple images, with the second pattern elements providing the remaining parts of each of those images. In a preferred example, the pattern of first and second pattern elements defines sections of at least two images interleaved with one another periodically in at least a first dimension, each section preferably having a width of 50 microns or less in at least the first dimension, more preferably 30 microns or less, most preferably 20 microns or less. It should be noted in that in such cases the first and second pattern elements themselves may not be arranged periodically since their locations will be defined by the first and second images.

The manufacturing method is preferably a continuous process performed on the substrate web as it is conveyed from one reel on to another. The substrate web may be supplied in metallised form or the metal layer (and optionally any colour layer, backing layer and/or filter layer) could be applied onto the transparent substrate prior to step (b) as part of the same, in-line process.

The patterned mask could be provided in a number of ways, including as a plate or belt which is conveyed alongside the substrate web. However, in particularly preferred implementations, the mask is provided on a circumferential surface of a patterning roller, and the transport path includes at least a portion of the circumferential surface of the patterning roller, and wherein at least during the exposing of the photosensitive resist layer to radiation, the patterning roller rotates such that its circumferential surface travels at substantially the same speed as the substrate web. In this way, the mask forms an integral part of the transport path and the construction of the manufacturing line is simplified.

Preferably, the patterning roller comprises a support roller which is at least semi-transparent to radiation of the predetermined wavelength, at least in the vicinity of the predetermined pattern. For example, the support roller may be a quartz or glass cylinder (hollow or solid). A suitable radiation source can be located inside the roller. The mask could be either integral with or separable from the support roller. In one advantageous implementation, the mask comprises a masking sheet, carried by the support roller, of which at least a region is substantially opaque to radiation of the predetermined wavelength so as to define the predetermined pattern, wherein the mask is preferably separable from the support roller. This enables the production of different patterns using the same basic apparatus, replacing the mask as appropriate. Advantageously, the masking sheet is flexible so as to conform to the exterior or interior surface of the support roller. In this way, the mask can be patterned whilst flat using conventional laser etching or photopatterning techniques, and then affixed to the support roller. Alternatively, the mask could be formed into a cylindrical shape before mounting to the support roller.

The mask could comprise a radiation-opaque material such as a metal sheet with appropriate cut-outs to define the pattern. However, it is preferred that the masking sheet comprises a carrier layer which is at least semi-transparent to radiation of the predetermined wavelength and a masking layer, present only in the region(s) corresponding to the predetermined pattern, which is substantially opaque to radiation of the predetermined wavelength. This arrangement is more durable and results in less surface relief which, if the mask is arranged to directly contact the substrate web in use, could otherwise damage the web. In particularly preferred examples, the carrier layer comprises a polymeric material, preferably PET or BOPP, each of which has an appropriate transparency and degree of flexibility.

The masking layer could take any form capable of absorbing radiation of the predetermined wavelengths. In preferred examples, the masking layer comprises a patterned metallisation, preferably a photo-patterned or laser-etched metallisation.

In alternative embodiments, the mask preferably comprises one or more markings formed on or in the circumferential surface of the support roller, the or each marking being substantially opaque to radiation of the predetermined wavelength, the marking(s) defining the predetermined pattern. Here, the mask is not separable from the support roller, but the durability of the mask can be increased.

Preferably, the transport path is configured to wrap around at least a portion of the patterning roller, whereby the substrate web is urged against the circumferential surface of the patterning roller. This reduces the risk of any slippage between the mask and the substrate web, and also improves the resolution of the transferred pattern due to the close proximity of the mask and the web. Advantageously, this may be assisted by providing at least one tensioning roller in the transport path.

In preferred embodiments, the substrate is substantially transparent (i.e. clear, but may carry a coloured tint). For example, the substrate may be formed of a non-fibrous, polymer material such as BOPP.

In many cases, a single image element array manufactured as described above will be adequate for formation of the security device. However in some cases it is advantageous to provide a second image element array on the opposite surface of the substrate. This can be used to form a second, independent optically variable security effect if an opaque layer exists between the two metal layers or, if the substrate is transparent, the two metal layers may form part of the same security device, e.g. co-operating to form a moiré interference device or a venetian blind effect.

Therefore, in preferred embodiments, in step (a) the metallised substrate web further comprises a second metal layer on the second surface of the substrate, and the method further comprises manufacturing a second image element array by:

(b') applying a second photosensitive resist layer to the second metal layer; and (c') exposing the second photosensitive resist layer to radiation of a wavelength to which the second photosensitive resist layer is responsive through a patterned mask, by conveying the substrate web along the transport path and, during the exposure, moving the patterned mask alongside the substrate web along at least a portion of the transport path at substantially the same speed as the substrate web, such that there is substantially no relative movement between the mask and the substrate web, wherein the patterned mask comprises first pattern elements in which the mask is substantially opaque to the radiation and second pattern elements in which the mask is substantially transparent to the radiation, whereupon the exposed second pattern elements of the first photosensitive resist layer react resulting in increased solubility by an etchant substance, the non-exposed first pattern elements remaining relatively insoluble by etchant substance; and (d') applying etchant substance(s) to the substrate web whereupon the second pattern elements of both the second resist layer and the second metal layer are dissolved, the remaining first pattern elements of the second metal layer forming a second image element array.

The second metal layer and resist could be different from the first metal layer and its resist, in which case the two sides of the substrate web will need to be processed differently. However in preferred examples, the second photosensitive resist and the respective etchant substances are of the same composition as the first metal layer, the first photosensitive resist and the first and second etchant substances, respectively. In this case sides of the substrate can be etched simultaneously.

The patterns exhibited by the two image arrays will depend on the effects which are to be exhibited by the device(s). In some cases the two patterns may be the same as one another at least in regions of the device. In preferred examples, the respective patterns are adapted to co-operate with one another to exhibit an optically variable effect. For example, the two patterns may form in combination a security device without any additional components (such as focussing elements) required, such as a venetian blind device or a moiré interference device. In many cases, the patterns according to which the first and second image arrays are formed are different and/or laterally offset from one another, allowing for the formation of more complex visual effects.

In order to ensure good alignment between the two image element arrays, it is strongly preferred that at least steps (c) and (c') are performed in register, preferably simultaneously. For example, the second photosensitive resist layer could be exposed through a second patterned mask moving alongside one surface of the substrate web at the same time as the first resist layer is exposed through the first mask on the opposite side of the web. For instance, two opposing rollers each carrying a patterned mask on its surface could be used for this purpose.

The first aspect of the present invention further provides a method of manufacturing a security device, comprising:

(i) manufacturing an image element array using the method described above; and (ii) providing a viewing component overlapping the image element array;

wherein the image element array and the viewing component are configured to co-operate to generate an optically variable effect.

The manufacture of the security device may take place as part of the same process as manufacturing the image array, or could be performed separately, e.g. by a different entity.

The viewing component could be provided before or after the image array is formed. The viewing component may be applied onto the substrate web, e.g. by printing, cast-curing or embossing, preferably on the opposite surface from that on which the image array is formed. Alternatively the viewing component could be provided on another (at least semi-transparent) substrate to which the image array is affixed.

The nature of the viewing component will depend on the type of security device being formed, and could comprise a masking grid or second image element array as described further below. However in particularly preferred embodiments, the viewing component comprises a focussing element array (e.g. of lenses or mirrors).

In a first preferred example, the security device is a moiré magnifier (including hybrid moiré magnifier/integral imaging devices). Thus, preferably, the first pattern elements define (substantially identical) microimages and the second pattern elements define a background, or vice versa, such that the image element array comprises a microimage array, and the pitches of the focusing element array and of the microimage array and their relative orientations are such that the focusing element array co-operates with the microimage array to generate a magnified version of the microimage array due to the moiré effect.

In a particularly preferred implementation, the image element array is provided with a colour layer having a plurality of zones each with respectively different optically detectable substances, wherein the zones of the colour layer are each sufficiently large so as to encompass at least the area occupied by one of the magnified microimages in the magnified version of the microimage array. This is desirable since by definition each zone will then be significantly larger than any one (unmagnified) microimage and hence encompass a plurality of the (unmagnified) microimages (preferably at least 10), with the result that the optical characteristics provided by the zone will persist in the magnified image. For example, in preferred embodiments each (unmagnified) microimage may have overall dimensions of around 25 microns in both directions, whereas each zone may have dimensions of the order of 2.5 mm, i.e. two orders of magnitude larger than the microimages.

In general, the individual (unmagnified) microimages will be too small to be discernible to the naked eye, whereas the zones of the colour layer will be sufficiently large to be apparent to the naked eye. If on the other hand the zones were of a comparable size to the (unmagnified) microimages, the various different zones would be "averaged" together by the moiré effect such that they would not be distinguishable in the final device. Moreover by arranging the zones to be at least the size of a magnified microimage (which will be determined by the focusing element array and its arrangement relative to the image array), at at least some viewing angles the whole of the microimage, or its immediate background, will be displayed with the optical characteristics of the same single zone, e.g. appearing with a uniform colour corresponding to that of the zone.

It is further preferable that the zones of the colour layer are configured such that, at a first viewing angle, the optical characteristics of a magnified microimage in the magnified version of the microimage array are determined by those of a first set of one or more of the zones of the colour layer and at a second viewing angle the optical characteristics of the same magnified microimage are determined by those of a second, different set of one or more of the zones of the colour layer such that the optical characteristics of the magnified microimage change between the first and second viewing angles. This is achieved by limiting the size of the zones so that the group of microimages which contribute to a particular magnified microimage at any one viewing angle crosses at least one boundary between adjacent zones as the viewing angle is changed. If the zones are too large then the boundaries between zones will not be encountered within the available range of viewing angles, or by only a very small proportion of the magnified microimages. In particularly preferred examples, at least some (preferably all) of the zones of the colour layer are smaller than the area occupied by two adjacent magnified microimages in the magnified version of the microimage array, in at least one dimension, preferably in both orthogonal dimensions. This enhances the effect since substantially all the microimages will display a change in optical characteristics when the viewing angle is changed in the appropriate direction. Most preferably, the zones of the colour layer are arranged with substantially the same periodicity as that of the magnified microimage array.

Depending on the arrangement of the zones and the separation between the viewing angles, the whole of the micro image may be displayed with different optical characteristics at the two viewing angles (i.e. the first set comprises a single zone of the colour layer and the second set comprises a different single zone of the colour layer). However, more generally the first set comprises a single zone of the colour layer such that at the first viewing angle the whole of the magnified microimage is displayed with the same optical characteristics corresponding to those of the single zone, and the second set comprises at least two zones of the colour layer such that at the second viewing angle at least two parts of the magnified microimage are displayed with different optical characteristics from one another, corresponding to those of the at least two zones. This gives the appearance of the microimage crossing a boundary between two (or more) adjacent zones as the viewing angle is changed.

In moiré magnifier devices such as this, if any light-diffusing layer is provided it is preferred that this is of a uniform appearance across the image array.

In a second preferred example, the security device is a ("pure") integral imaging device. Hence, the first pattern elements define microimages all depicting the same object from a different viewpoint and the second pattern elements define a background, or vice versa, such that the image element array comprises a microimage array, and the pitches and orientation of the focusing element array and of the microimage array are the same, such that the focusing element array co-operates with the microimage array to generate a magnified, optically-variable version of the object.

In a third preferred example, the security device is a two-channel lenticular device, the pattern being periodic and the first pattern elements being substantially identical to one another (e.g. line or "dot" elements as described above). The periodicity of the focusing element array is substantially equal to or a multiple of that of the pattern, at least in the first direction, and the focusing element array is configured such that each focusing element can direct light from a respective one of the first pattern elements or from a respective one of the second pattern elements therebetween in dependence on the viewing angle, whereby depending on the viewing angle the array of focusing elements directs light from either the array of first pattern elements in which the metal layer is present or from the second pattern elements therebetween in which the metal layer is absent, such that as the device is tilted light is reflected by the metal layer to the viewer by the first pattern elements in combination at a first range of viewing angles and not at a second range of viewing angles. Thus the appearance generated by the first pattern elements corresponds to one channel of the device and that by the second pattern elements to the second channel of the device. If a light-diffusing layer defining an image is provided, this will be displayed by the device at the first range of viewing angles, corresponding to the first channel of the device.

Preferably, the image array is provided with a colour layer as described previously, whereby the colour layer is exposed in the second pattern elements, such that as the device is tilted the colour layer is displayed to the viewer by the second pattern elements in combination at the second range of viewing angles and not at the first range of viewing angles. Hence the second channel of the device is defined by the colour layer and if this takes the form of an image, this image will be displayed by the device at the second range of viewing angles. In this case, highly complex colour layers such as full colour photographs are suitable, although simpler images can also be used.

In a fourth example, the security device is a lenticular device with at least two channels, the first and second pattern elements of the image array each defining parts of at least two interleaved images as described previously. In such cases it is preferable, though not essential, that the appearance, e.g. colour, of the first pattern elements is uniform across the array, and so is that of the colour layer. For example the finished array may be duotone. The periodicity of the focusing element array is substantially equal to or a multiple of that of the sections of the at least two images defined by the pattern, at least in the first direction, and the focusing element array is configured such that each focusing element can direct light from a respective one of the first image sections or from a respective one of the second image sections therebetween in dependence on the viewing angle, whereby depending on the viewing angle the array of focusing elements directs light from either the array of first image sections or from the second image sections therebetween, such that as the device is tilted the first image is displayed to the viewer by the first image sections in combination at a first range of viewing angles and the second image is displayed to the viewer by the second image sections at a second range of viewing angles. In this case the first image corresponds to the first channel of the device and the second image to the second channel of the device. More than two images could be provided by interleaving sections from each in the same way.

In lenticular devices, preferably the focusing element array is registered to the array of image elements at least in terms of orientation and preferably also in terms of translation.

The optically variable effect exhibited by the security device may be exhibited upon tilting the device just one direction (i.e. a one-dimensional optically variable effect), or in other preferred implementations may be exhibited upon tilting the device in either of two orthogonal directions (i.e. a two-dimensional optically variable effect). Hence preferably the focussing element array comprises focusing elements adapted to focus light in one dimension, preferably cylindrical focusing elements, or adapted to focus light in at least two orthogonal directions, preferably spherical or aspherical focussing elements. Advantageously, the focussing element array comprises lenses or mirrors. In preferred examples, the focusing element array has a one- or two-dimensional periodicity in the range 5-200 microns, preferably 10-70 microns, most preferably 20-40 microns. The focusing elements may been formed for example by a process of thermal embossing or cast-cure replication.

In order for the security device to generate a focused image, preferably at least the metal layer is located approximately in the focal plane of the focusing element array, and if a colour layer is provided, the colour layer is preferably also located approximately in the focal plane of the focusing element array at least in the second pattern elements. It is desirable that the focal length of each focussing element should be substantially the same, preferably to within +/−10 microns, more preferably +/−5 microns, for all viewing angles along the direction(s) in which it is capable of focussing light.

As mentioned above, in alternative embodiments the viewing component may comprise a masking grid or a second image element array. For instance, this configuration may be used to form security devices such as venetian blind effects and moiré interference devices. Viewing components of these sorts could be formed by any convenient technique, e.g. printing, but most preferably are manufactured using the same demetallisation process as described above.

The first aspect of the invention further provides an image array for a security device, and a security device each manufactured in accordance with the above-disclosed methods.

A second aspect of the invention provides a security device, comprising a transparent substrate carrying:
- a focusing element array defining a focal plane; and
- an image element array defining an array of microimages against a background, located in a plane substantially coincident with the focal plane of the focusing elements;
- the pitches of the focusing element array and of the array of microimages and their relative locations being such that the focusing element array cooperates with the array of microimages to generate a magnified version of the microimage array due to the moiré effect;

wherein the image element array comprises:
- a patterned layer of substantially opaque material, the array of microimages being defined by the absence of the substantially opaque material and the background being defined by the presence of the substantially opaque material; and
- a colour layer overlapping the patterned layer of substantially opaque material and being exposed through the patterned layer where the substantially opaque material is absent, the colour layer comprising a plurality of different optically detectable materials in a respective plurality of laterally offset zones of the array, the zones each being at least as large as the area occupied by one of the magnified microimages in the magnified version of the microimage array and the zones being configured such that, at a first viewing angle, the optical characteristics of a magnified microimage in the magnified version of the microimage array are determined by those of a first set of one or more of the zones of the colour layer and at a second viewing angle the optical characteristics of the same magnified microimage are determined by those of a second, different set of one or more of the zones of the colour layer such that the optical characteristics of the magnified microimage change between the first and second viewing angles.

It will be appreciated that the security device of the second aspect of the invention is a moiré magnification device (which term includes hybrid moiré magnification/integral imaging devices). Hence the microimages are preferably substantially identical to one another, as defined above. By configuring the zones of the colour layer as described, when the device is tilted (i.e. the viewing angle is changed) in at least one direction, at least one (preferably all) of the magnified microimages will appear to undergo a change in its optical characteristics, preferably in its visible colour. The term "colour layer" takes the same definition as explained with reference to the first aspect of the invention.

As a result of the described arrangement, each zone of the colour layer will be significantly larger than any one (unmagnified) microimage and hence encompass a plurality of the (unmagnified) microimages (preferably at least 10), with the result that the optical characteristics provided by the zone will persist in the magnified image. For example, in preferred embodiments each (unmagnified) microimage may have overall dimensions of around 25 microns in both directions, whereas each zone may have dimensions of the order of 2.5 mm, i.e. two orders of magnitude larger than the microimages.

In general, the individual (unmagnified) microimages will be too small to be discernible to the naked eye, whereas the zones of the colour layer will be sufficiently large to be apparent to the naked eye. If on the other hand the zones were of a comparable size to the (unmagnified) microimages, the various different zones would be "averaged" together by the moiré effect such that they would not be distinguishable in the final device. Moreover by arranging the zones to be at least the size of a magnified microimage (which will be determined by the focusing element array and its arrangement relative to the image array), at at least some viewing angles the whole of the microimage, or its immediate background, will be displayed with the optical characteristics of the same zone.

The change in optical characteristics upon tilting is achieved by limiting the size of the zones so that the group of microimages which contribute to a particular magnified microimage at any one viewing angle crosses at least one boundary between adjacent zones as the viewing angle is changed. If the zones are too large then the boundaries between zones will not be encountered within the available range of viewing angles, or by only a very small proportion of the magnified microimages. In particularly preferred examples, at least some (preferably all) of the zones of the colour layer are smaller than the area occupied by two adjacent magnified microimages in the magnified version of the microimage array, in at least one dimension, preferably in both orthogonal dimensions. This enhances the effect since substantially all the microimages will display a change in optical characteristics when the viewing angle is changed by a sufficient amount in the appropriate direction. Most preferably, the zones of the colour layer are arranged with substantially the same periodicity as that of the magnified microimage array.

Depending on the arrangement of the zones and the separation between the viewing angles, the whole of the micro image may be displayed with different optical characteristics at the two viewing angles (i.e. the first set comprises a single zone of the colour layer and the second set comprises a different single zone of the colour layer). However, more generally the first set comprises a single zone of the colour layer such that at the first viewing angle the whole of the magnified microimage is displayed with the same optical characteristics corresponding to those of the single zone, and the second set comprises at least two zones of the colour layer such that at the second viewing angle at least two parts of the magnified microimage are displayed with different optical characteristics from one another, corresponding to those of the at least two zones. This gives the appearance of the microimage crossing a boundary between two (or more) adjacent zones as the viewing angle is changed.

It is desirable that the change in optical characteristics can be observed at tilt angles which are likely to be encountered during normal handling. Therefore, preferably, the angular separation between the first and second viewing angles is 50 degrees or less, more preferably 30 degrees or less.

In particularly preferred embodiments, the colour layer is configured in the form of an image arising from the arrangement of the zones and/or the shape of the periphery of the zones, the image preferably comprising indicia such as one or more letters or numbers, logos or other symbols. The image element array may include one or more zones in which the colour layer is absent or transparent. For example, the combined periphery of the optically detectable colour layer zones may define an alphanumerical character or other indicia. Outside these zones the microimages may be transparent or have a lower contrast with the background, with the result that the magnified microimages are less visible, the area exhibiting the magnified visual effect therefore conforming to the shape of the indicia.

Advantageously the optically detectable substance(s) comprise any of: visibly coloured dyes or pigments; luminescent, phosphorescent or fluorescent substances which emit in the visible or non-visible spectrum; metallic pigments; interference layer structures and interference layer pigments. Most preferably, adjacent zones of the colour layer have different visible colours from one another.

In preferred embodiments, to reduce the amount of light transmitted through the device, the image element array further comprises a substantially opaque backing layer over the colour layer across the array, the substantially opaque backing layer preferably comprising a metal layer. The substantially opaque backing layer improves the appearance of the image element array by obstructing the transmission of light through the array which may otherwise confuse the final visual effect. A reflective material such as a metal layer is particularly preferred for use as the backing layer in order to enhance the reflective appearance of the device. The substantially opaque backing layer is preferably applied across the whole extent of the image element array including any regions outside the zones of the colour layer. In such regions, if the backing layer is of substantially the same appearance as the patterned metal layer, the contrast between the first and second pattern elements will be reduced or even eliminated. This may be desirable to limit the final visual effect to those zones where the colour layer is provided.

In the second aspect of the invention, the patterned layer could be formed of any substantially opaque material and may be applied by any suitable means, e.g. printing or filling of pre-formed recesses. However, in particularly preferred embodiments, the patterned layer of substantially opaque material comprises a metal layer, preferably aluminium or copper. The patterned layer of substantially opaque material may further comprise a filter layer (as described in relation to the first aspect of the invention) between the metal layer and the transparent substrate. In this case the filter layer is preferably of uniform appearance across the array.

Advantageously, the surface of the transparent substrate may define an optically variable effect generating relief structure, the patterned metal layer conforming to the contours of the relief structure on one or both of its sides, wherein the optically variable effect generating relief structure is preferably a diffractive relief structure, most preferably a diffraction grating, a hologram or a kinegram.

The optically variable effect exhibited by the security device may be exhibited upon tilting the device in just one direction (i.e. a one-dimensional optically variable effect), or in other preferred implementations may be exhibited upon tilting the device in either of two orthogonal directions (i.e. a two-dimensional optically variable effect). Hence preferably the focussing element array comprises focusing elements adapted to focus light in one dimension, preferably cylindrical focusing elements, or adapted to focus light in at least two orthogonal directions, preferably spherical or aspherical focussing elements. Advantageously, the focussing element array comprises lenses or mirrors. In preferred examples, the focusing element array has a one- or two-dimensional periodicity in the range 5-200 microns, preferably 10-70 microns, most preferably 20-40 microns. The focusing elements may been formed for example by a process of thermal embossing or cast-cure replication.

In particularly preferred embodiments, the image element array is manufactured in accordance with the method of the first aspect of the invention.

The present invention further provides a security article comprising a security device according to the first or second aspect of the invention, wherein the security article is preferably a security thread, strip, foil, insert, transfer element, label or patch.

Also provided is a security document comprising a security device according to the first or second aspect of the invention, or a security article comprising such a security device, wherein the security document is preferably a banknote, cheque, passport, identity card, driver's licence, certificate of authenticity, fiscal stamp or other document for securing value or personal identity. In a particularly preferred embodiment, the substrate provided in step (a) of the first aspect of the invention itself forms the substrate of a security document, such as a polymer banknote, the metal layer being disposed on the substrate as previously described and one or more opacifying layers being applied to the same substrate to provide a suitable background for printing thereon.

Examples of security devices, image element arrays therefor and their methods of manufacture in accordance with the present invention will now be described and contrasted with conventional examples, with reference to the accompanying drawings, in which:

FIGS. 1(a) and 1(b) illustrate typical positive and negative resist materials, respectively, and the regions of each which react when exposed to appropriate radiation through a mask;

FIG. 3 is a flow chart depicting steps in an embodiment of a method in accordance with the present invention;

Figure 4A:
Figure 4B:
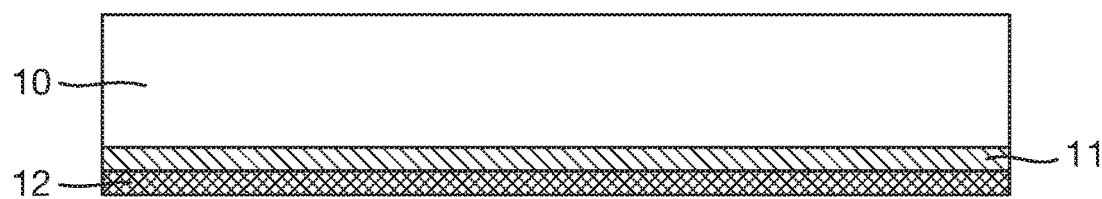
Figure 4C:
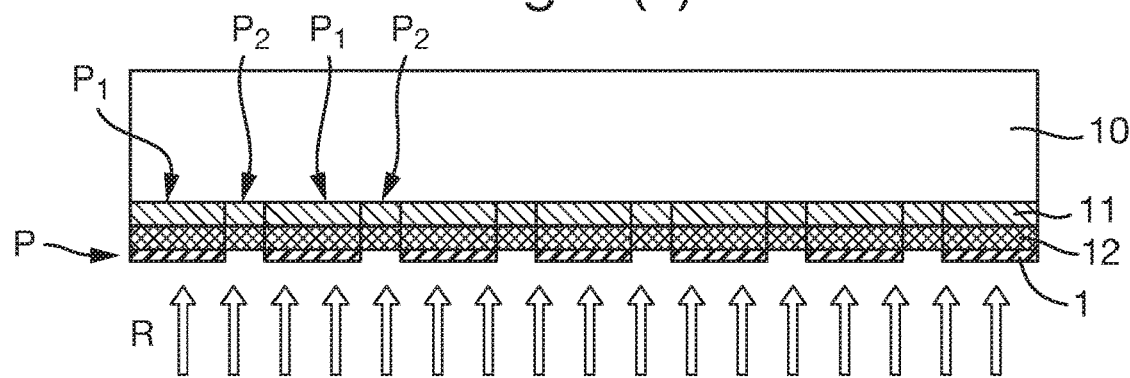
Figure 4D:
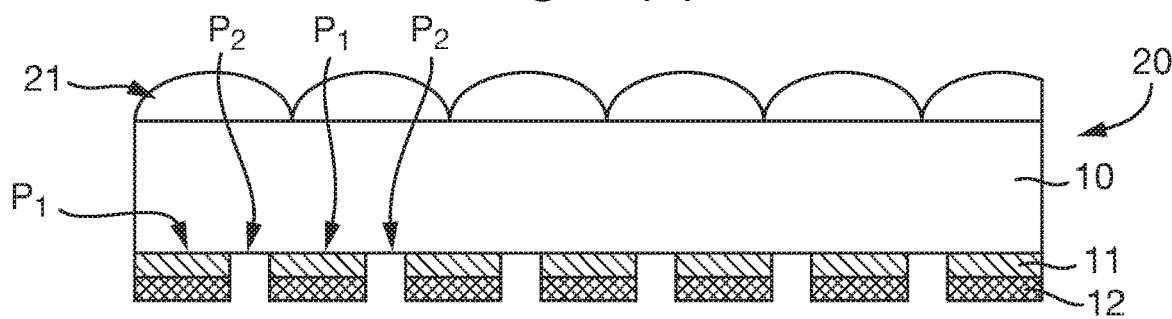
Figure 5A:
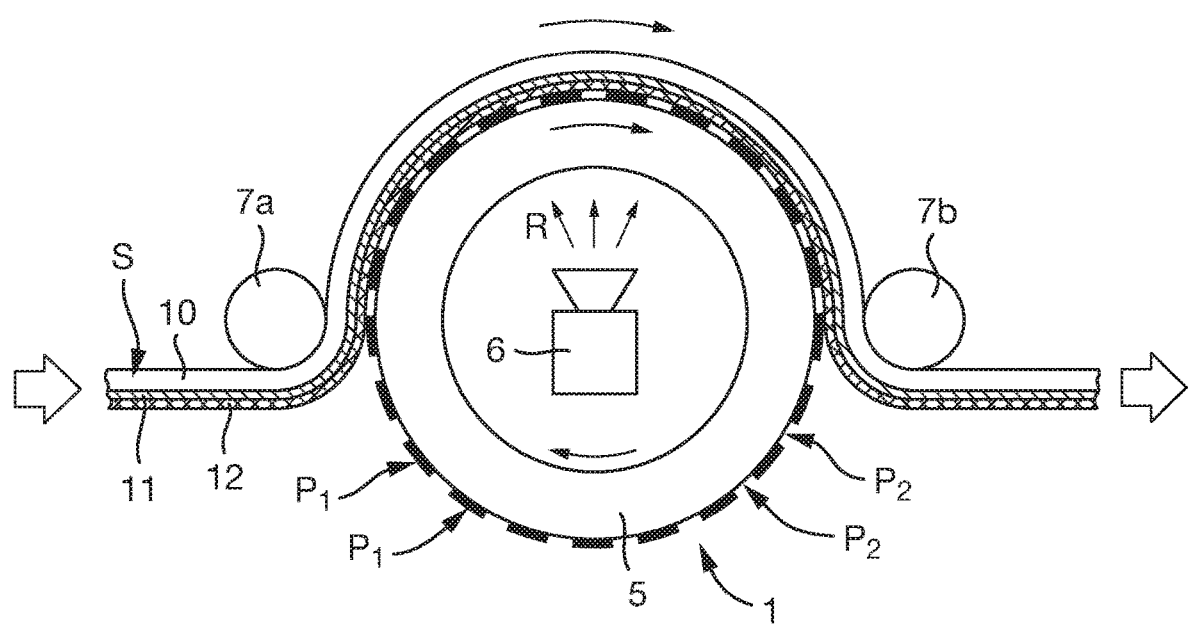
Figure 6A:
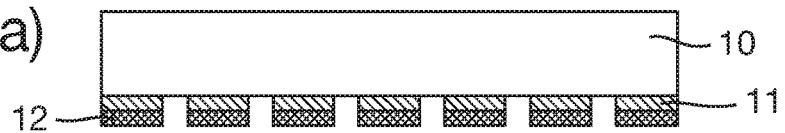
Figure 6B:
Figure 6C:
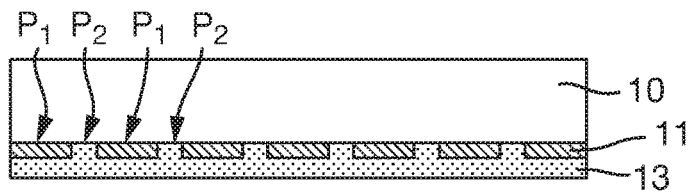
Figure 6D:
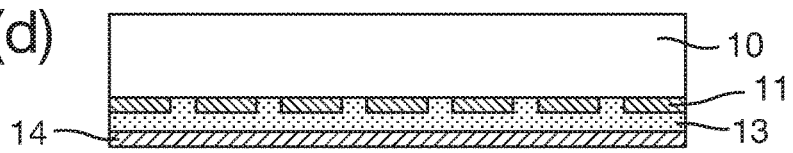
Figure 6E:
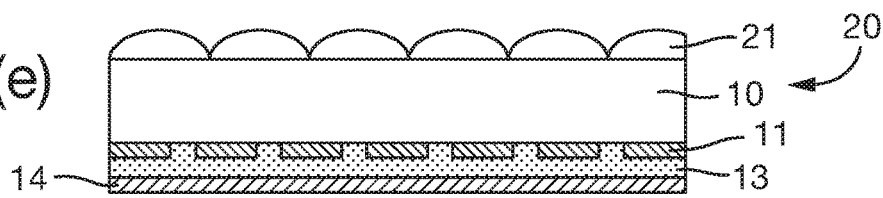
Figure 6I:
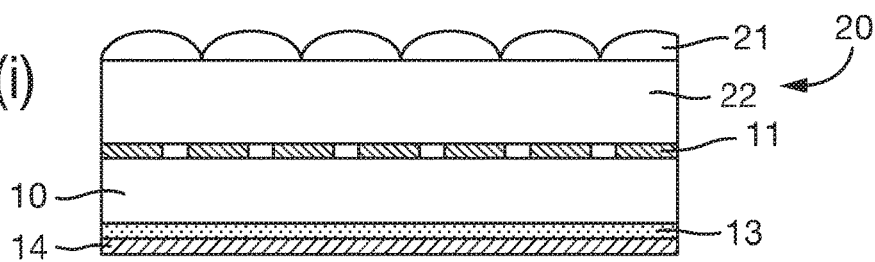
Figure 7A:
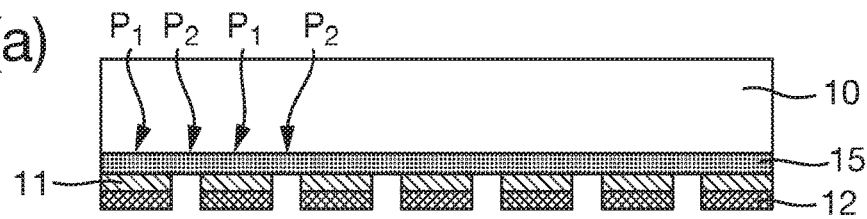
Figure 7B:
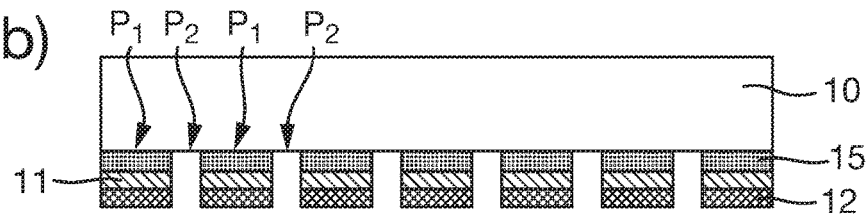
Figure 7C:
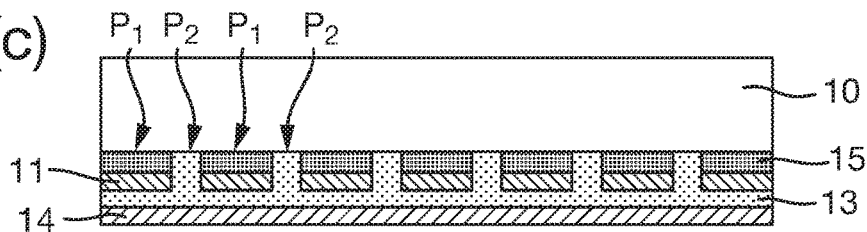
Figure 8A:
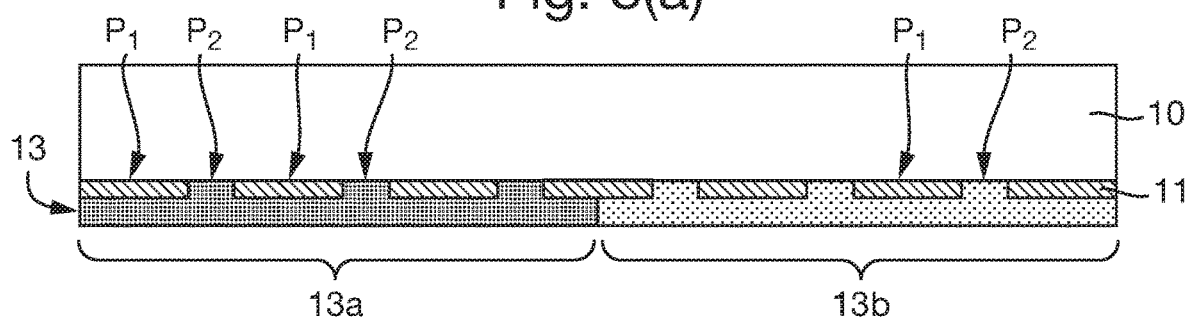
Figure 9A:
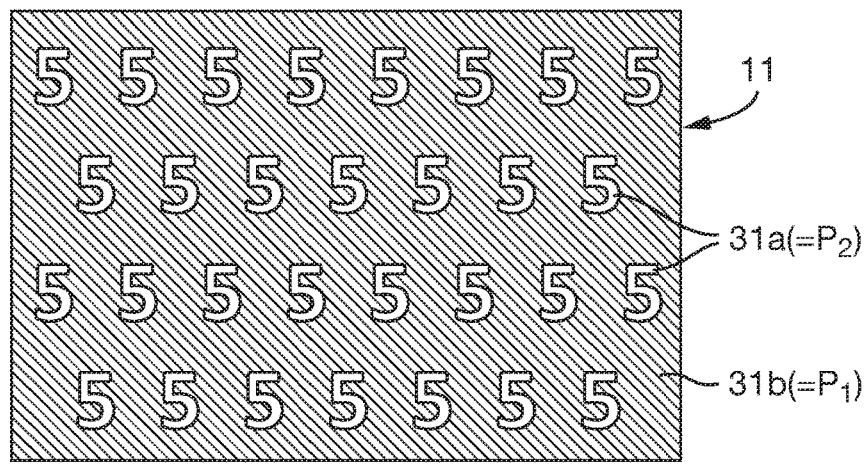
Figure 9B:
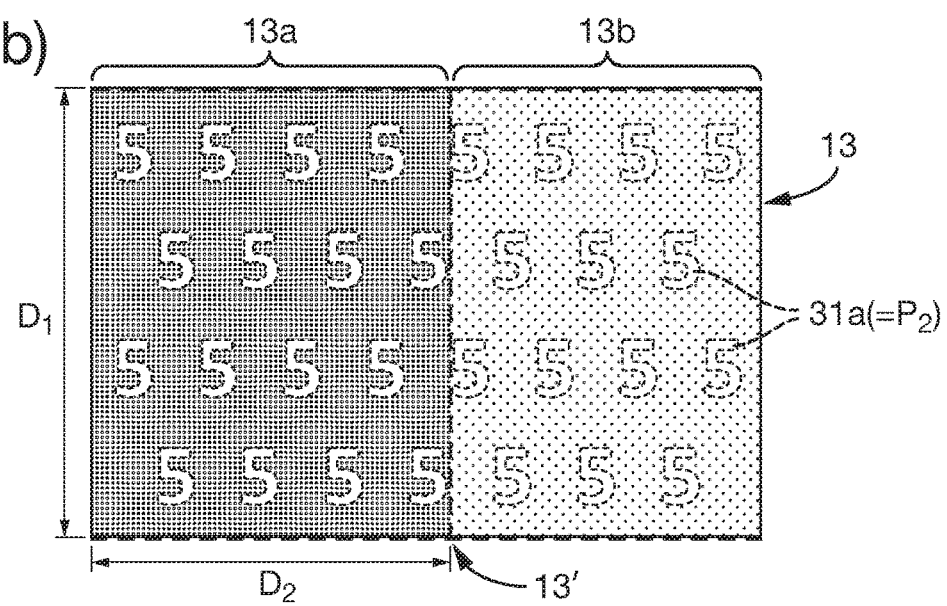
Figure 9C:
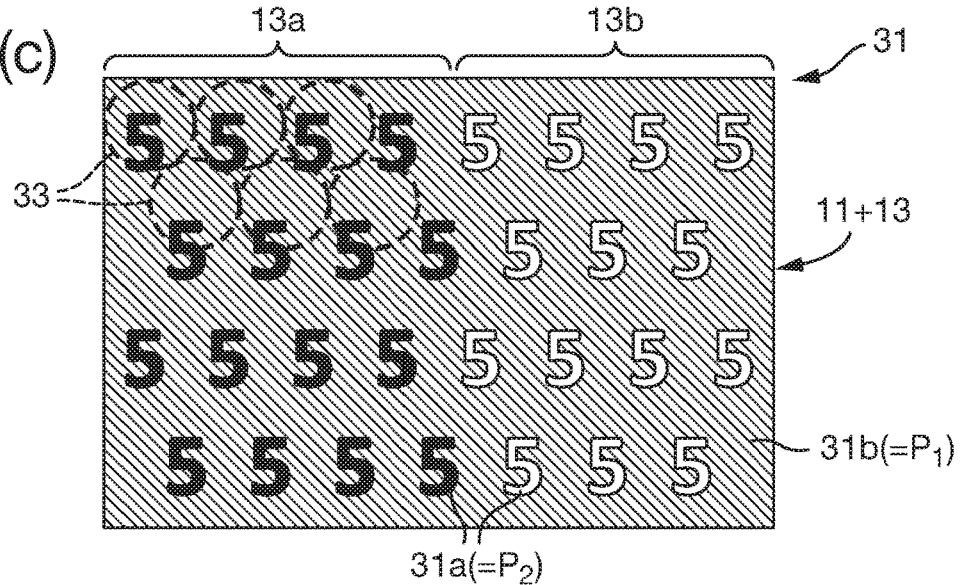
Figure 10A:
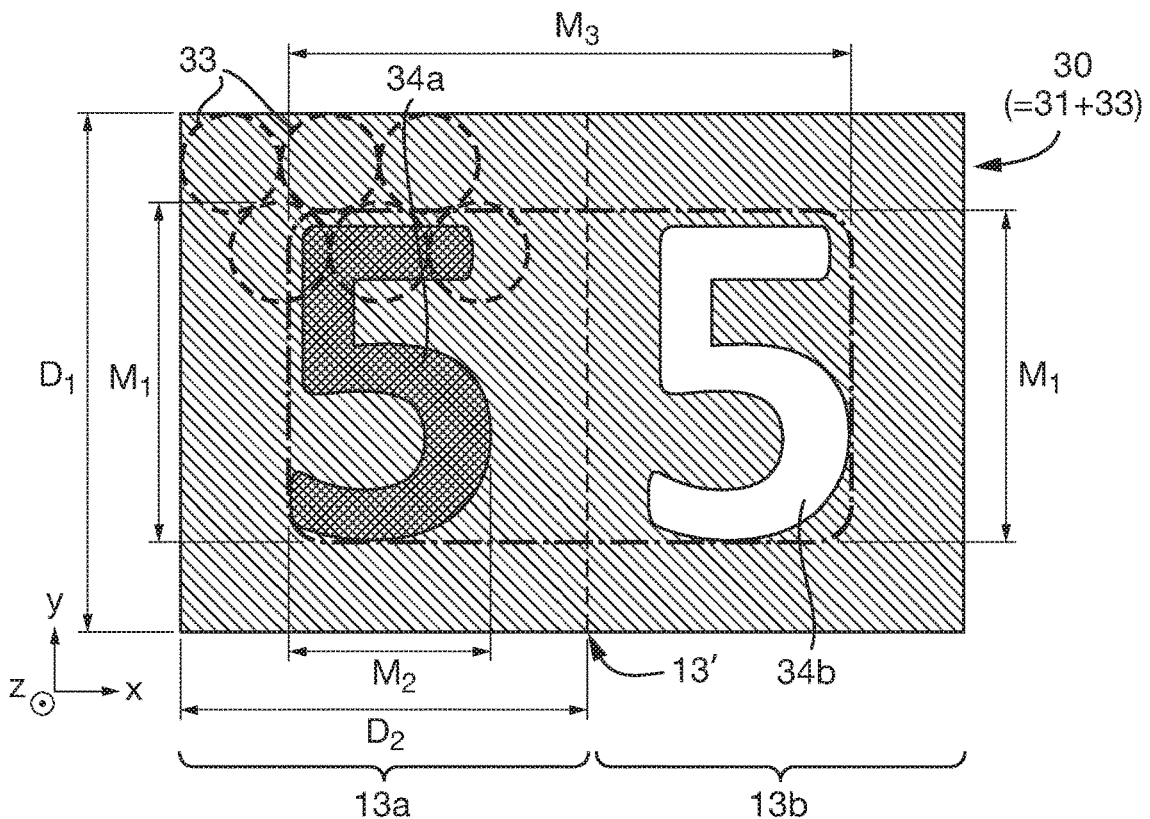
Figure 11A:
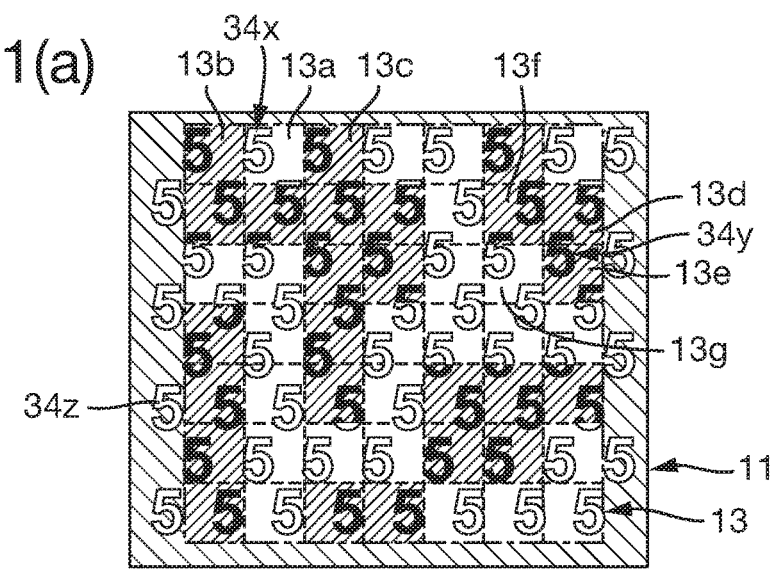
Figure 11B:
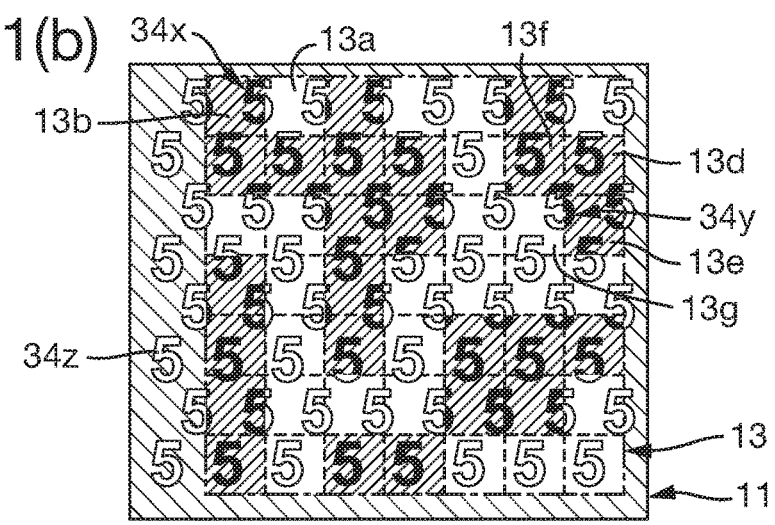
Figure 11C:
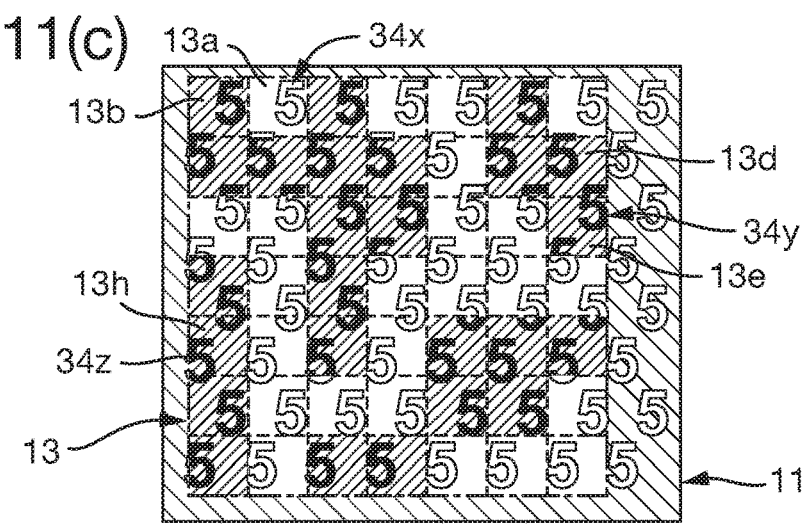
Figure 12:
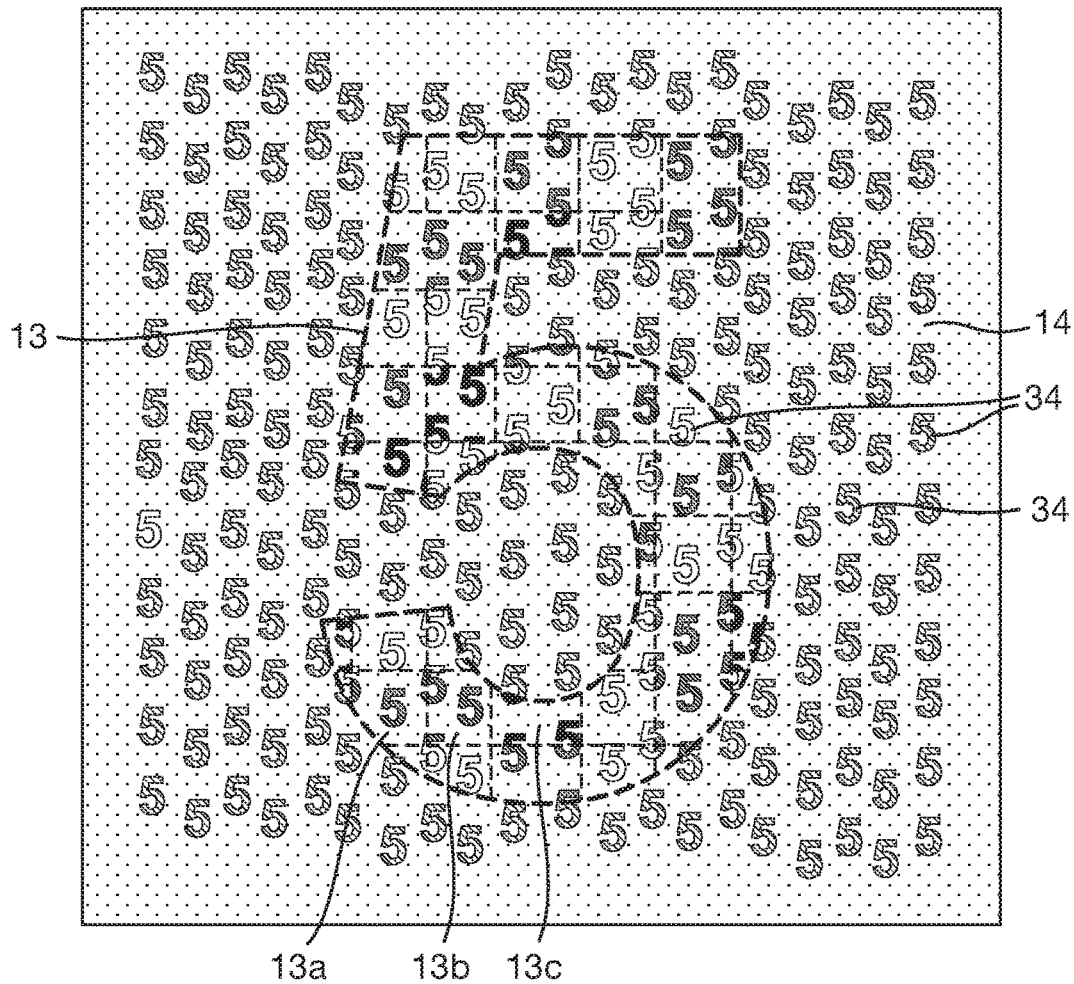
Figure 13A:
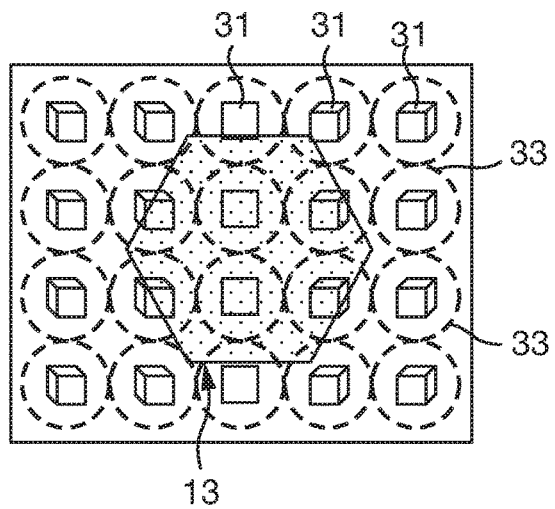
Figure 13B:
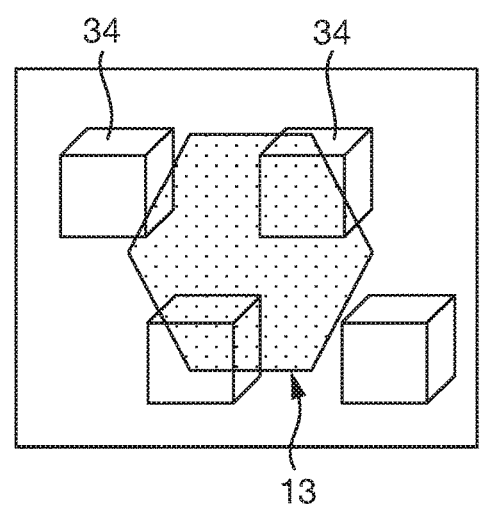
Figure 14A:
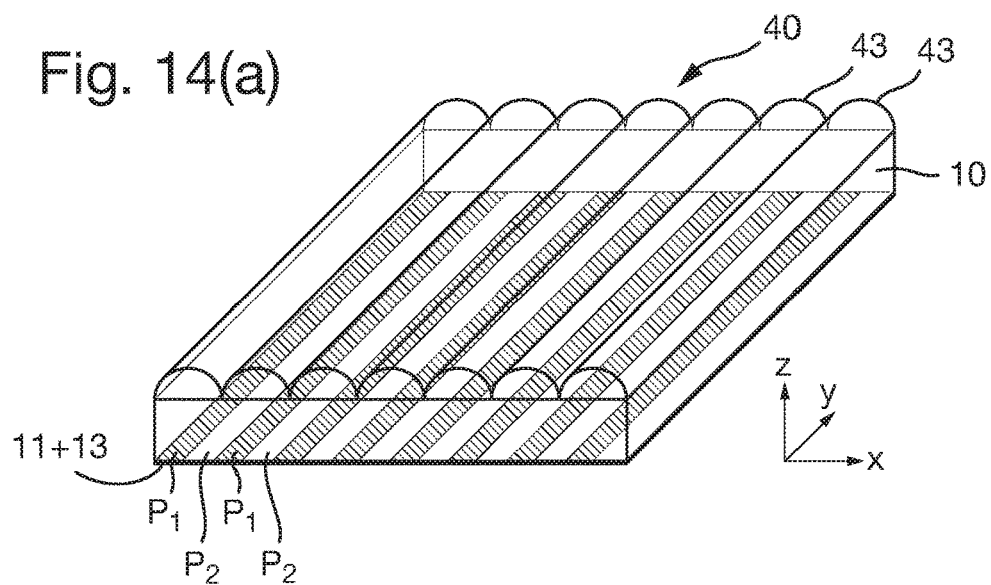
Figure 14B:
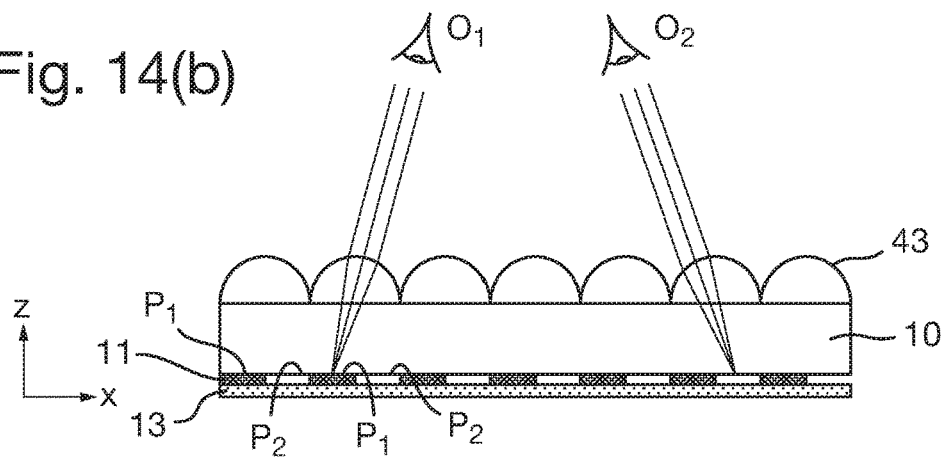
Figure 14C:
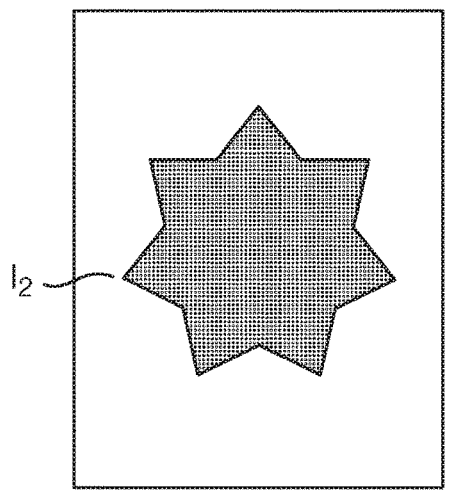
Figure 14D:
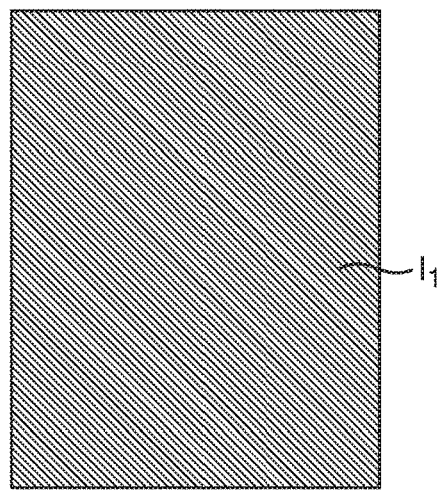
Figure 15A:
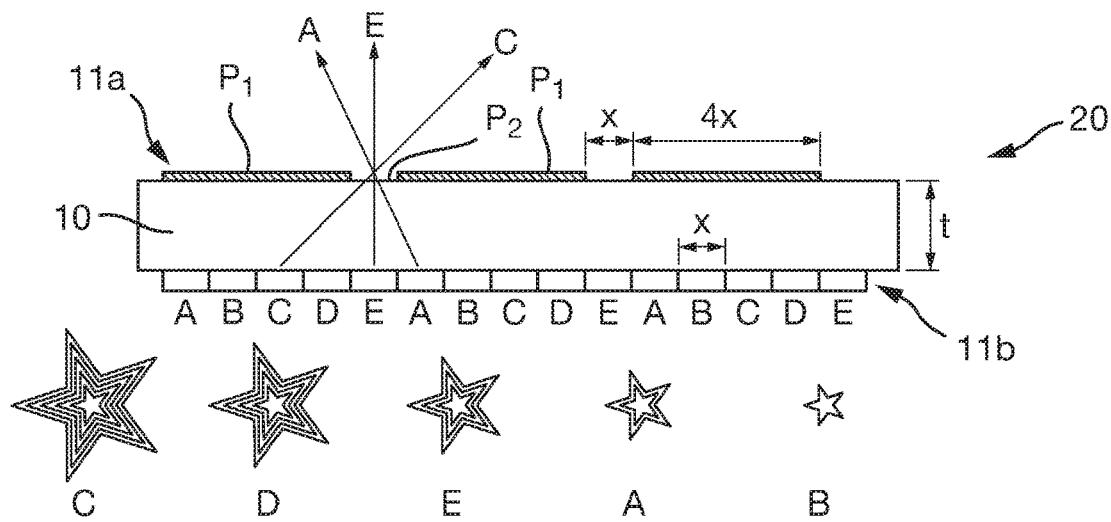
Figure 15B:
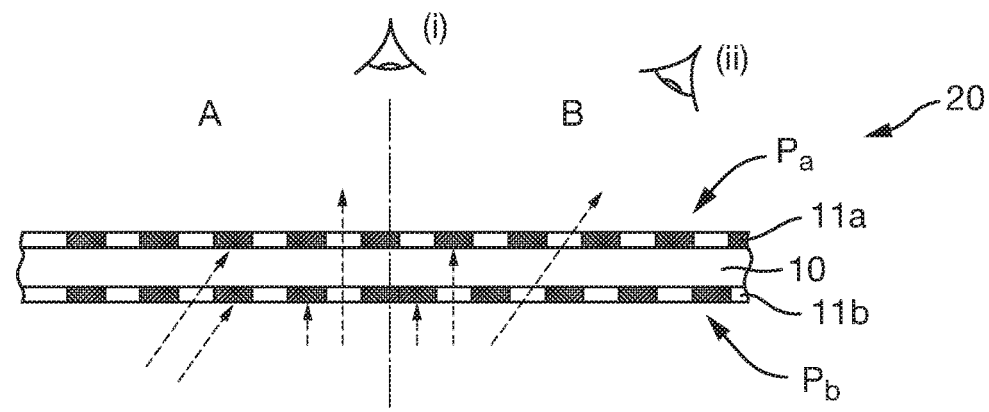
Figure 15C:
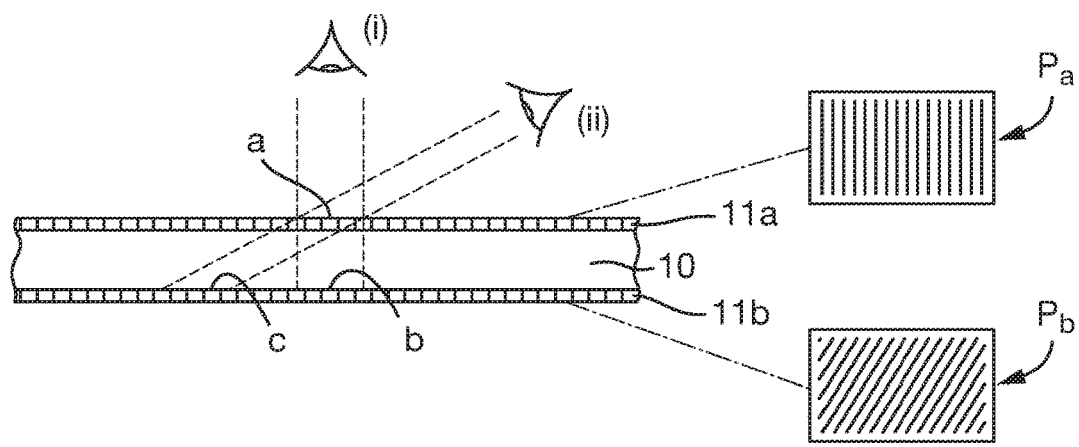
Figure 16A:
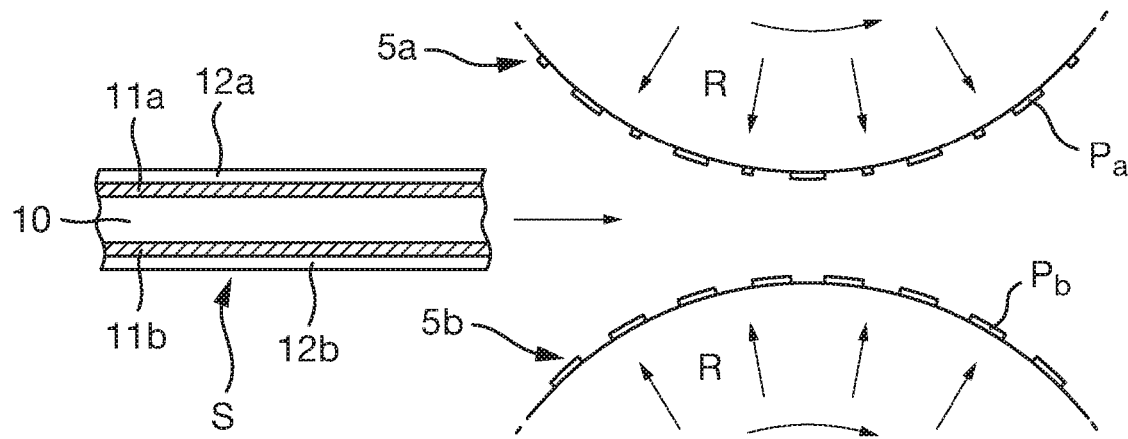
Figure 17:
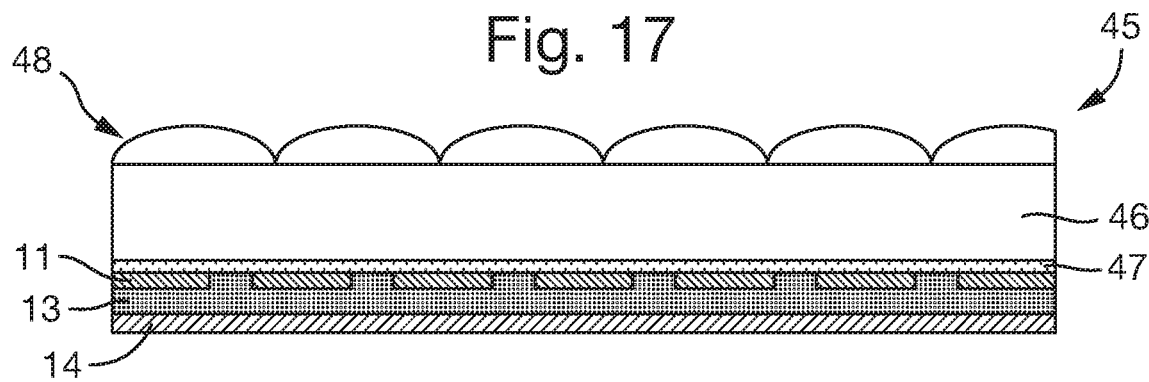
Figure 18A:
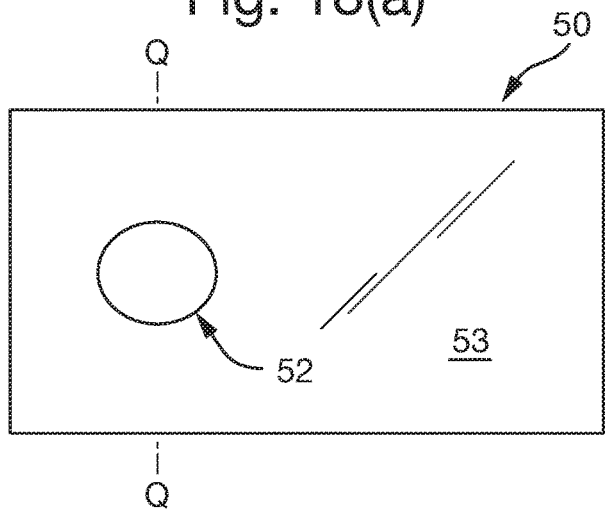
Figure 18B:
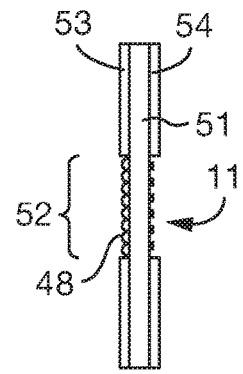
Figure 19A:
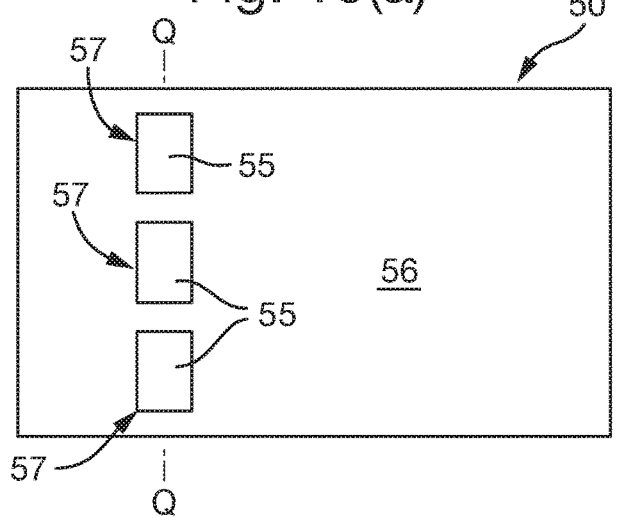
Figure 19B:
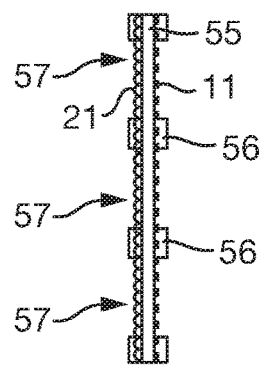
Figure 20A:
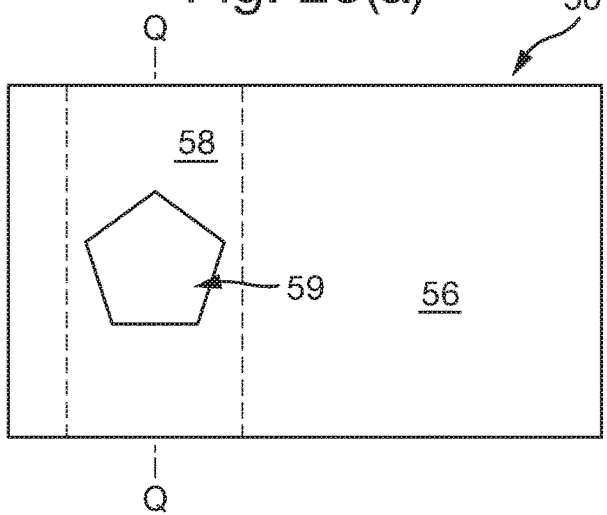
Figure 20B:
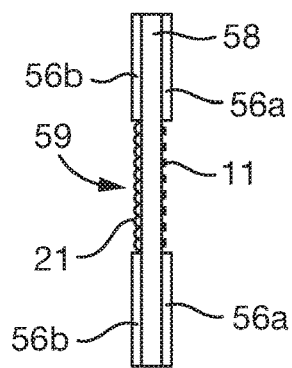

FIGS. 4(a) to (c) illustrate selected steps of the method of FIG. 3, FIG. 4(d) showing an embodiment of a security device made in accordance with the method;

FIGS. 5(a) and (b) schematically depict two exemplary apparatus for carrying out selected steps of the method of FIG. 3;

FIGS. 6(a) to (d) illustrate further selected steps of the method of FIG. 3, FIG. 6(e) showing a further embodiment of a security device made in accordance with the method, and FIGS. 6(i) and (ii) showing still further embodiments of the security device made in accordance with the method;

FIGS. 7(a) to (c) illustrate selected steps of another embodiment of a method in accordance with the present invention;

FIGS. 8(a) and (b) depict two embodiments of image element arrays in accordance with the present invention;

FIGS. 9(a) to (c) illustrate in plan view an exemplary image element array in accordance with an embodiment of the present invention, FIG. 9(a) showing a metal layer, FIG. 9(b) showing a colour layer and FIG. 9(c) showing the two layers in combination;

FIGS. 10(a) and (b) show in plan view the appearance of a security device in accordance with an embodiment of the present invention incorporating the image element array of FIG. 9, at two different viewing angles;

FIGS. 11(a) to (c) schematically illustrate in plan view the appearance of a security device in accordance with another embodiment of the present invention, at three different viewing angles;

FIG. 12 shows in plan view the appearance of a security device in accordance with a further embodiment of the present invention;

FIG. 13(a) illustrates an exemplary image element array in accordance with an embodiment of the invention, and FIG. 13(b) shows the appearance of a security device incorporating the image element array of FIG. 13(a);

FIG. 14(a) schematically depicts a security device in accordance with a further embodiment of the present invention, FIG. 14(b) showing a cross-section through the security device, and FIGS. 14(c) and (d) showing two exemplary images which may be displayed by the device at different viewing angles;

FIGS. 15(a) to (c) show three further embodiments of security devices in accordance with embodiments of the invention;

FIGS. 16(a) and (b) show two further examples of apparatus suitable for carrying out selected steps of methods in accordance with embodiments of the invention;

FIG. 17 shows a cross section through a security device in accordance with another embodiment of the invention;

FIGS. 18, 19 and 20 show three exemplary articles carrying security devices in accordance with embodiments of the present invention (a) in plan view, and (b) in cross-section; and FIG. 21 illustrates a further embodiment of an article carrying a security device in accordance with the present invention, (a) in front view, (b) in back view and (c) in cross-section.

The ensuing description will focus initially on examples of methods of manufacturing image element arrays with high resolution, fine detail as is required for use in security devices such as moiré magnifiers, integral imaging devices and lenticular devices (amongst others). Preferred embodiments of such security devices making use of image element arrays made in accordance with the described method will then be described below. However it should be appreciated that the disclosed image arrays and methods of manufacture thereof can be adapted for use in other security devices and similarly the image arrays utilised in the security devices described below need not be manufactured using the disclosed method, although this is preferred.

As summarised previously, in embodiments of the invention, image elements are formed by demetallising a metal layer in accordance with a desired pattern. As shown in FIG. 1(a), the metal layer 11 is coated with a resist material 2 which is responsive to radiation of a particular wavelength, typically one or more ultraviolet wavelengths, e.g. in the range 350 to 415 nm. The resist 2 is exposed to the radiation R through a patterned mask 1. The resist 2 is a "positive" resist meaning that the material reacts on exposure to the radiation to become soluble (or more soluble) in a selected etchant. For example, the photochemical reaction may cause a reduction in cross-linking within the resist material ("photo disassociation"), resulting in the increased solubility. The present inventor has found that the use of a "positive" resist achieves higher resolution results as compared with "negative" resists in which the exposed material reacts to become insoluble (or less soluble), particularly where the desired pattern comprises demetallised fine line features such as negative indicia defined as metal-free regions against continuous metal surroundings. As shown in FIG. 1(a), the reacted (soluble) portion 2a of the resist 2 extends only a short way beyond the perimeter of the transparent portion of the mask 1 defining the fine line negative indicia, with the remainder 2b of the layer remaining relatively insoluble such that the resulting demetallised line width corresponds closely to that defined by the mask 1.

For comparison, FIG. 1(b) shows a negative resist layer 3, which reacts to become less soluble when exposed to appropriate radiation, e.g. undergoing cross-linking. In this case, to form the same demetallised pattern as illustrated in FIG. 1(a), the mask 1 is the reverse of that used in FIG. 1(a), obscuring the fine line region which is to form the negative indicia. There will be some lateral extension of the reacted regions 3b which will impinge on the unreacted, insoluble region 3a of the resist under the opaque portion of mask 1, such that the size of the demetallised feature will not match that of the mask and may fail to form entirely in the case of very fine lines.

Figure 2:
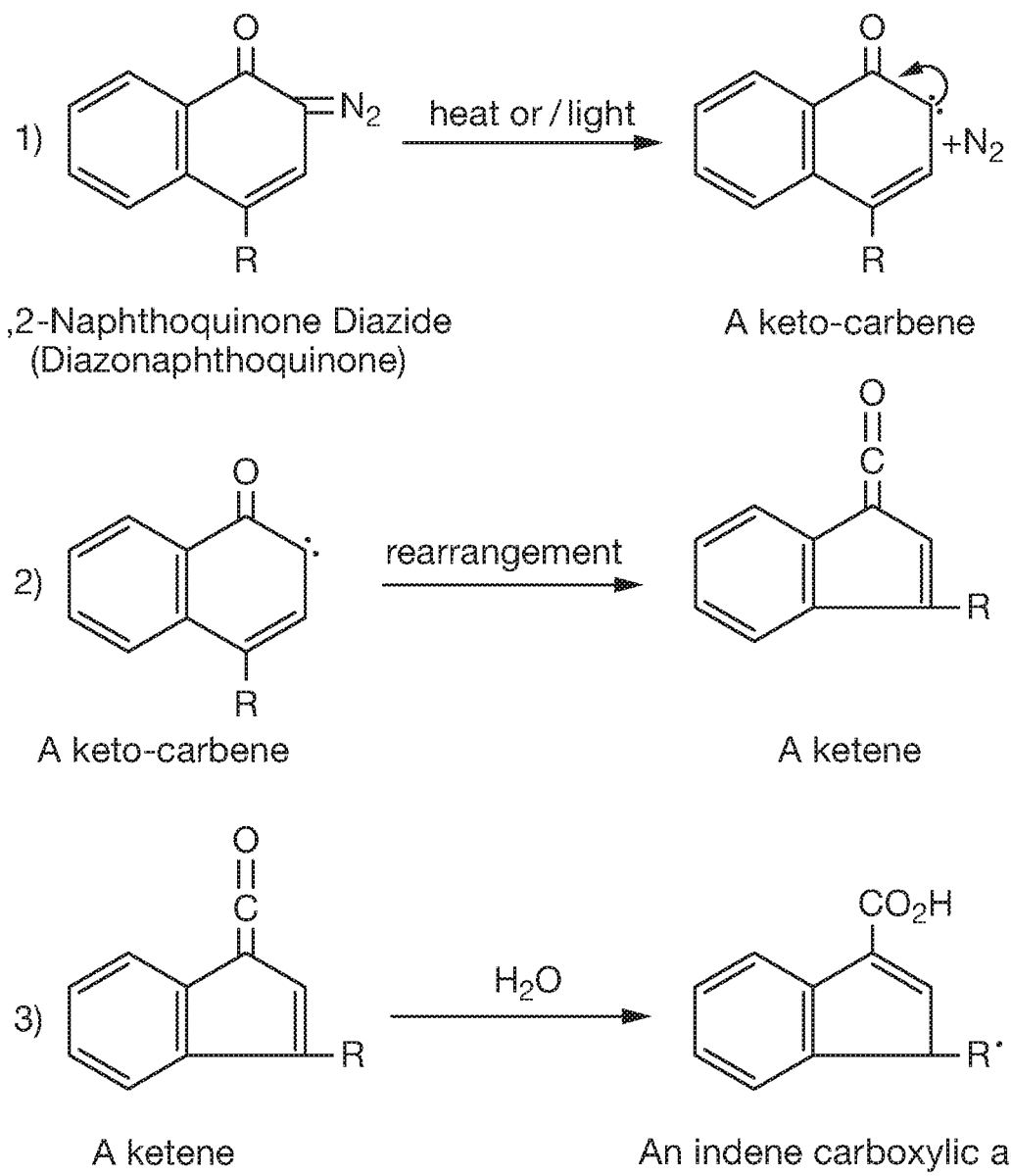
FIG. 2 depicts a chemical reaction undergone by an exemplary resist material on exposure to radiation of an appropriate wavelength.

Preferred examples of suitable positive resist materials, used in embodiments of the present invention, include Diazonaphthoquinone-based resists ("DNQ"), also known as ortho quinine diazides ("OQDs"), such as 1, 2-Naphthoquinone Diazide. The material is substantially non-soluble in alkali in its initial state. Upon exposure to UV light (e.g. utilising a mercury halide lamp), a reaction occurs as depicted in FIG. 2, resulting in the formation of a carboxylic acid group ("Wolf rearrangement"). The reacted material is soluble in alkali conditions. In particularly preferred embodiments, by utilising a metal layer which is also soluble in alkali, such as aluminium, aluminium alloy (at least 50% Al), chromium or chromium alloy (at least 50% Cr), application of an alkaline etchant such as sodium hydroxide will remove not only the exposed regions of the resist material but also the underlying portions of the metal layer, allowing for both layers to be removed in a single processing step. For chromium and its alloys, an addition of potassium hexacyanoferrate to the etchant may be required. One suitable commercially available positive resist material is V215 by Varichem Co. Ltd., which comprises a DNQ with a novolak ballast group. Further examples include sulfonyl compounds of the diazo, such as 1,2-Naphthoquinone-2-Diazide-5-sulfonyl chloride. The DNQ substance may be applied as a solution in a suitable solvent such as cyclopentanone, e.g. a 10% (w/w) solution. The solvent and any other volatile components will be dried off after application of the resist to the metal layer, leaving the DNQ and any other solid components to form the resist layer. If necessary a heater or other drying module may be provided to assist this.

Five further examples of suitable positive resist compositions which can be utilised in the above embodiment are as follows ("g"=gram):

1) 1 g V215 by Varichem Co. Ltd. or 1, 2-Naphthoquinone-2-Diazide-5-sulfonyl chloride; 10 g Cyclopentanone; 1 g MEK; and 0.03 g Surfynol 61 (from Air Products).

2) 1 g V215 by Varichem Co. Ltd. or 1, 2-Naphthoquinone-2-Diazide-5-sulfonyl chloride; 10 g Cyclopentanone; 1 g MEK; and 0.01 g Byk-055 (from Byk Chemie).

3) 1 g V215 by Varichem Co. Ltd. or 1, 2-Naphthoquinone-2-Diazide-5-sulfonyl chloride; 10 g Cyclopentanone; 1 g MEK; and 0.01 g Byk-022 (from Byk Chemie).
4) 1 g V215 by Varichem Co. Ltd. or 1, 2-Naphthoquinone-2-Diazide-5-sulfonyl chloride; 10 g Cyclopentanone; 1 g MEK; and 0.2 g Isopropyl alcohol.
5) 0.95 g V215 by Varichem Co. Ltd. or 1, 2-Naphthoquinone-2-Diazide-5-sulfonyl chloride; 0.05 Novolak resin; 10 g Cyclopentanone; 1 g MEK; and 0.05 g Surfynol 61 (from Air Products).

It will be appreciated that each of the example compositions above describes the wet composition of the resist as applied to the metal layer. Upon drying (which may or may not involve an active drying step but may occur automatically during the time between process steps), the solvent and any other volatile components will evaporate leaving only the solid components. Hence in example composition (1), the DNQ makes up 100% of the dry resist formulation but only approximately 10% of the wet resist composition. In example (5), the Novolak resin is an example of a binder which is a solid component and hence remains in the dry resist formulation. Therefore in this example the DNQ makes up 95% of the dry resist formulation, the remaining 5% being binder.

Surfynol 61, used in compositions 1 and 5 above, is an example of a surfactant. Resist compositions containing a surfactant such as this have been found by the present inventors to produce particularly good results in the presently disclosed method. The benefit of the surfactant is to assist in forming a more even resist coating. Without the surfactant the coating thickness was found to vary more widely across the substrate. This can lead to difficulties in controlling the downstream processing steps of irradiation and etching, because the thicker sections of the resist require a longer processing time. With the surfactant the resist coating was found to be of much more uniform thickness, meaning that the amount of time under the exposure and through the etchant is the same for the whole coating.

The use of a volatile surfactant (of which Surfynol 61 is an example) is particularly preferred since upon drying of the resist layer, the surfactant substance transitions to a gaseous state and exits the system so as not to interfere with downstream processing. However, non-volatile surfactants have also been found to achieve the above mentioned benefits to some degree.

If the metal layer is of a type which is not soluble (or dissolves only very slowly) in alkaline conditions, a second different etchant may be used in some embodiments to remove the exposed elements of the metal layer once the reacted elements of the resist layer have been removed by the first etchant. For instance, where the metal layer comprises copper, copper alloy (at least 50% Cu), chromium or chromium alloy (at least 50% Cr), an acidic second etchant may be used. However in more preferred examples, a suitable positive resist composition which also dissolves (after radiation exposure) in acidic conditions will be used instead, such that the resist and metal can both be removed by a single acidic etchant.

FIG. 3 is a flow diagram illustrating steps in a method of manufacturing an image element array (or optionally a security device) in accordance with an embodiment of the invention. Steps shown in dashed lines are optional. FIG. 4 illustrates selected ones of the steps in an exemplary implementation of the method. First, a metallised substrate web is provided (step S101), which comprises a transparent substrate 10 carrying a metal layer 11 on one of its surfaces, as shown in FIG. 4(a). The substrate 10 typically comprises at least one transparent polymeric material, such as BOPP, and may be monolithic or multi-layered. The substrate may be of a type suitable for forming the basis of a security article such as a security thread, strip, patch or transfer foil, or of a type suitable for forming the basis of a security document itself, such as a polymer banknote. The substrate web may include additional layers, such as a filter layer (described below) and/or a primer layer underlying the metal layer 11. The substrate web could also carry additional security features such as an optically variable relief structure, e.g. a diffraction structure such as a hologram, kinegram or diffraction grating, which the metal layer follows, over all or part of the web surface. The substrate web may be supplied pre-metallised, or the metal layer 11 (and any optional underlying layer(s)) could be applied as part of the presently disclosed method, e.g. by vapour deposition, sputtering or the like. The metal layer 11 may cover the whole area of the substrate (as shown) or could be provided only across selected portion(s) of the substrate within which the demetallised pattern is to be formed. Suitable metals include aluminium, copper, chromium and alloys of each (including in particularly aluminium-copper alloys). The metal layer is preferably substantially opaque to visible light and is desirably as thin as possible whilst achieving this opacity. The thinner the layer, the more accurately it can be etched since it will be less susceptible to lateral spread of the etched region. In preferred examples, the metal layer may have a thickness of between 10 and 100 nm, more preferably between 10 and 50 nm, most preferably between 10 and 25 microns.

In step S103, a resist material 12 is then applied onto the metal layer 12, as shown in FIG. 4(b). The resist material may be applied all over the substrate web area or could be applied selectively, e.g. to define a large-scale pattern or image (sufficiently large to be visible to the naked eye). Suitable application techniques include printing or coating the resist material onto the metal layer. The resist material is a "positive" resist (as described above), which upon exposure to appropriate radiation becomes soluble (or more soluble) in an etchant substance (i.e. a solvent) in which the selected metal layer is preferably also soluble. For example, where the metal layer 11 comprises aluminium, a resist material containing a DNQ is suitable since both can be etched using an alkali such as sodium hydroxide. Depending on the composition of the resist material, the web may be passed through a dryer before onward processing.

The resist material 12 is then exposed to appropriate radiation R through a patterned mask 1, as shown in FIG. 4(c)—step S104. The mask 1 defines the desired pattern in terms of first pattern elements $P_1$ in which the mask is substantially opaque to the radiation, and second pattern elements $P_2$ in which the mask is substantially transparent to the radiation. During exposure, the mask preferably contacts the resist layer 12 in order that the regions of the resist layer exposed to the radiation correspond to the transparent elements of the mask 1 as accurately as possible. As will be described in more detail below, exposure takes place during transport of the substrate web and hence the mask is also moved alongside the web at substantially the same speed. In the second pattern elements $P_2$, the exposed resist material 12 reacts to become soluble in the selected etchant (or more soluble), whereas in the first pattern elements $P_1$, the resist material receives substantially no radiation and therefore remains (relatively) insoluble in the etchant.

In step S105, the selected etchant(s) are applied to the substrate web, preferably dissolving both the resist material 12 and the metal layer 11 in the second pattern elements $P_2$.

Preferably, a single etchant is used to achieve this. For example, in the case of an aluminium metal layer 11 and a DNQ resist layer 12, the etchant is typically an alkali such as a solution of sodium hydroxide (NaOH). The first pattern elements $P_1$ of the metal layer 11 remain on the web, as shown in FIG. 4(d). The removal of the resist material 12 and the metal layer 11 by the same etchant is highly advantageous since no second etchant substance is required. Preferably both materials are removed in a single processing step. However, the same etchant substance could be applied multiple times if necessary to achieve the removal. The etchant can be applied by conveying the substrate web through a bath of the etchant or by spraying the etchant onto the web, for instance. This may be accompanied by one or more mechanical actions such as brushing or agitation to assist in dissolution, if necessary. In other embodiments, if the metal layer 11 is of a type which will not be dissolved by the same etchant as the resist, step S105 may further comprise applying another, different (e.g. acidic) etchant, after the irradiated regions of the resist have been removed, to dissolve the exposed elements of the metal layer. Suitable acidic etchants includes sulphuric acid and nitric acid.

Experiments have shown that the achievable resolution, i.e. the minimum dimensions of the pattern elements that can be obtained, depend on many variables including the thickness of resist layer 12, the etchant concentration and the etching time, but initial studies indicate that the resist thickness and etching time appear to be particularly significant important factors. In one example, a sample was manufactured in accordance with the above-described method, having a metal layer 11 of aluminium and a resist layer 12 of V215 as a 10% (w/w) solution in cyclopentanone applied by a kbar drawdown with a thickness of around 0.6 microns. The resist layer was exposed to UV radiation through a mask for approximately a second, using a Primarc unit comprising a mercury halide lamp with a power of around 150 W/cm. The exposed substrate web was immersed in an etchant comprising 15% w/w/NaOH solution at room temperature for 15 seconds, which was found to achieve good line definition in the metal layer, achieving demetallised line widths of the order of 5 microns. Another sample produced in the same way immersed in the etchant for 20 second showed a notable amount of under-etching of the resist, increasing the achievable line width. Nonetheless in both cases a high definition (e.g. between 5 and 10 micron line width) image can be made, which would be very difficult with conventional printing techniques.

The thickness of the resist also has an impact on achievable line width, thinner coatings requiring a shorter etching time. As such, it is preferred that the resist be applied to the substrate using a method which achieves a substantially even coat weight across the area of the web such as using a post metered slot die. Thinner resist layers also exhibit less undercutting of the mask, i.e. reduced lateral spread of the reacted region. As such, preferred resist layers have a thickness of less than 1 micron, more preferably between 0.2 and 0.6 microns. Particularly good results have been obtained using a resist coating of approximately 0.35 microns.

The result of steps S101, S103, S104 and S105 is an image element array made up of first pattern elements $P_1$ formed of metal layer 11, spaced by second pattern elements $P_2$ where the metal is absent. This can be incorporated into a security device such as a moiré magnifier, integral imaging device or lenticular device by combining the so-formed image element array with an overlapping array of focusing elements such as lenses (step S109), or alternatively combined with some other viewing component such as a viewing grid or another image element array, e.g. to form a venetian blind device or a moiré interference device (examples below). An example of a focussing element array 21 is also shown in FIG. 4(d) which therefore depicts an example of a security device 20. In this case the focusing element array is disposed on the opposite surface of the transparent substrate 10, e.g. by lamination or cast curing, although other constructions are also envisaged as described further below. It will also be appreciated that focusing element array 21 could be applied to the substrate web prior to the formation of the image element array, or at any stage during the above manufacturing process.

FIGS. 5(a) and (b) show two examples of apparatus suitable for carrying out step S104 of the above method. In the embodiment of FIG. 5(a), the substrate web is conveyed around a roller 5 which incorporates the patterned mask 1, in this case carrying the mask 1 on its surface. A radiation source 6 is disposed inside the roller 5, which is at least partially transparent to the radiation, at least around a portion of the roller's circumference. The roller may be made from quartz, for example. The mask 5 may be formed in the surface of the roller itself or could take the form of an additional layer carried on its surface. For instance, the pattern could be engraved in the surface of the roller 5 and the engravings filled with radiation-opaque material to form the first pattern elements $P_1$, the gaps therebetween forming second pattern elements $P_2$. Alternatively the pattern may be formed as apertures defining second pattern elements $P_2$ in an otherwise opaque sheet such as metal which is affixed to the roller surface.

The substrate web S is arranged to make close contact between the resist layer 12 and the mask 1 as it is conveyed around the roller. This can be achieved by appropriate tensioning rollers 7a, 7b for example. The roller 5 rotates with the substrate web at substantially the same speed so that during exposure there is substantially no relative movement between the resist and the mask. The duration of exposure can be adjusted by changing the speed at which the web is conveyed, although typically a short exposure time of around 1 second is sufficient, depending on the power of the radiation source.

Figure 5B:
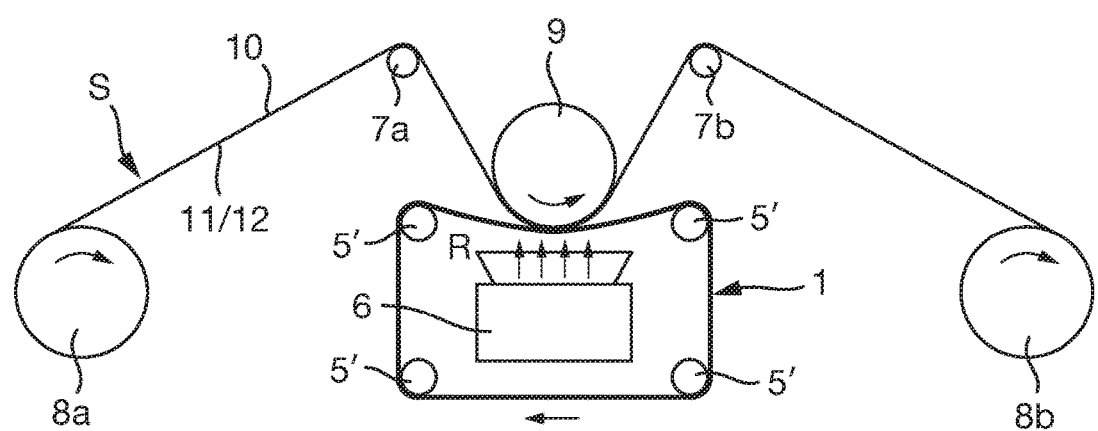

FIG. 5(b) shows an alternative arrangement in which the patterned mask 1 takes the form of a belt which is supported by a number of rollers 5', in this case four. The mask belt 1 is opposed by a roller 9 (or other guide structure) and the substrate web S is conveyed through the nip between the two. The mask belt 1 is driven around the rollers 5' at substantially the same speed as the substrate web S. A radiation source 6 is positioned so as to irradiate the resist layer 12 through the mask 1 as it passes through the nip. As before, the mask is arranged so as to make close contact with the resist layer 12 during exposure. This can be achieved using tensioning rollers 7a, 7b to hold the substrate web closely against the roller 9, and positioning belt rollers 5' so as to wrap the belt 1 around a portion of the circumference of the roller 9 or hold it taught against a point on the roller surface.

FIG. 5(b) also shows reel 8a from which the substrate web may be supplied at the start of the process, and reel 8b onto which the substrate web may be wound after exposure has taken place. Other processing steps such as applying etchant (s) to the substrate web may take place before the web is wound up (i.e. between tensioning roller 7b and reel 8b), or may be performed in a later process. Typically, similar reels 8a, 8b will be employed where apparatus such as that shown in FIG. 5(a) is utilised and the same considerations apply.

Figure 6:
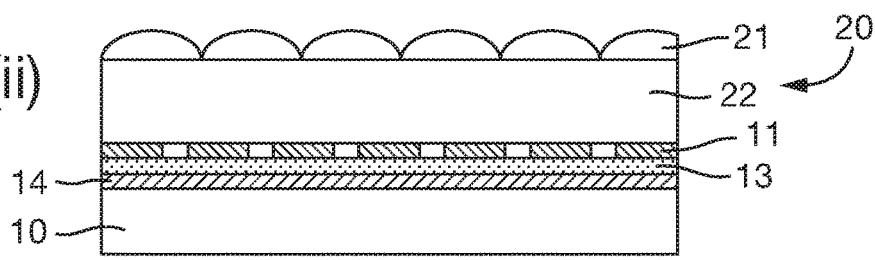

FIG. 6 illustrates further optional but preferred steps in the manufacture of the image element array. FIG. 6(a) shows the image element array as produced by the steps S101, S103, S104 and S105 described above. The remaining portions of resist material 12 may be left in situ since they will not be visible when the image element array is viewed through substrate 10. However, in order to minimise the thickness of the finished security device it is preferred to remove the remaining resist and this can be achieved by applying a further etchant in which the non-exposed resist is soluble, and the metal layer is not (step S106). In the case of a DNQ resist, methyl ethyl ketone (MEK) etchant is suitable. The resulting structure is shown in FIG. 6(b).

In the image element arrays produced so far, the first pattern elements $P_1$ will all have the same appearance (corresponding to that of metal layer 11), and the second pattern elements $P_2$ will be transparent. This may be desirable in some implementations of security devices. However in many cases it is preferable to modify the optical characteristics of the second pattern elements $P_2$ and this can be achieved, in one example, by applying a colour layer 13 over the patterned metal layer 11 (step S107), as shown in FIG. 6(c). The colour layer 13 comprises at least one optically detectable substance and is applied over at least a zone of the array. Whilst in preferred cases the colour layer will have a visible colour (i.e. visible to the naked eye), this is not essential since the at least one optically detectable substance could be, for example, a luminescent substance which emits outside the visible spectrum and is only detectable by machine. In general, the colour layer may comprise any of: one or more visible dyes or pigments; luminescent, phosphorescent or fluorescent substances; metallic pigments; interference layer structures or interference layer pigments (e.g. mica, pearlescent pigments, colour-shifting pigments etc), for example. Substances such as these may be dispersed in a binder to form an ink, for example, suitable for application by printing or coating, or could be applied by other means such as vapour deposition. Most preferably the colour layer is applied by a printing technique such as: laser printing, inkjet printing, lithographic printing, gravure printing, flexographic printing, letterpress or dye diffusion thermal transfer printing. Since the high resolution detail of the image element array is provided by the metal layer 11, the colour layer 13 does not need to be applied using a high resolution process and can if desired be applied in more than one working. In place of printing or coating, the colour layer 13 over the metal layer 11, the colour layer could also be formed on another substrate and then laminated to or transferred onto the metal layer 11. It should be noted that a colour layer 13 can also be applied over remaining elements of the resist layer 12 if step S106 has been omitted.

Since the colour layer 13 does not need to be applied at high resolution, it can be made relatively thick and therefore may possess sufficiently high optical density to produce a good quality image by itself. However, in some cases it is desirable to increase the optical density by applying a substantially opaque backing layer 14 over the colour layer 13 as depicted in FIG. 6(d) (step 108, not shown in FIG. 3). The backing layer 14 most preferably comprises a second metal layer, e.g. of aluminium. The provision of a backing layer reduces the amount of light transmitted through the device which could otherwise confuse the final image, thereby improving the visual appeal and (in the case of a metal backing layer) making the colour of the second pattern elements, provided by colour layer 13 more reflective and therefore more intense.

Finally, FIG. 6(e) shows the resulting image element array formed into a security device 20 by the application of focusing element array 21 (step S109) as previously described.

The colour layer 13 could alternatively be provided by laminating the colour layer 13 over the demetallised layer 11 to achieve substantially the same structure as shown in FIG. 6(e). In still further embodiments the colour layer could be located differently within the device structure, provided that from one side of the structure both the metal pattern elements $P_1$ and the portions of the colour layer 13 in the second pattern elements $P_2$ can be seen alongside one another. FIGS. 6(i) and (ii) show two further exemplary security devices with different structures to illustrate this.

In FIG. 6(i) the patterned metal layer 11 has been formed on the first surface of a transparent substrate 10 using the same method as previously described.

The colour layer 13 is provided on the second surface of the transparent substrate so that when the structure is viewed from the side of the metal layer 11, the colour layer is visible through the gaps in the second pattern elements.

Optionally, a substantially opaque backing layer 14 may be provided over the colour layer 13 on the second surface of the substrate as previously described. The so-formed assembly can then be laminated to a second transparent substrate 22 carrying focusing element assembly 21, the second substrate 22 providing the necessary optical spacing between the focussing elements and the image elements formed by metal layer 11 so as to place them substantially in the focal plane of the focusing elements. Preferably the thickness of the first substrate 10 is kept small so that the colour layer 13 is also close to the focal plane. It will be appreciated however that this structural configuration results in an increased device thickness as compared with that of FIG. 6(e).

In FIG. 6(ii) the colour layer 13 is provided on the first surface of substrate 10 before the patterned metal layer 11 is formed on the same surface. That is, the colour layer 13 is disposed on the metallised substrate web between the substrate and the metal layer 11 provided in step S101 of the above-described method. A substantially opaque backing layer 14 may optionally also be provided under the colour layer 13 on the first surface, or on the second surface of the substrate 10 (not shown). In these embodiments, the substrate 10 need not be transparent since the image element array will not be viewed through it in the finished device. A focusing element array 21 on a second (transparent) substrate 22 can then be laminated to the image element array to form the security device 20. Again, the end thickness of the device will be greater than that achievable in the FIG. 6(e) embodiment.

Embodiments in which the demetallised pattern is formed on a substrate with a pre-existing colour layer 13 (whether located on the first or second surface of the substrate) are better adapted for use in circumstances where no registration is desired between the colour layer 13 and the demetallised pattern, since it is technically more straightforward to register the application of the colour layer 13 to an existing demetallised pattern than vice-versa.

In many implementations, the uniformly metallic appearance of the first pattern elements $P_1$ will be desirable. However, the specularly reflective nature of the metal layer 11 can have the result that the appearance of the elements will depend significantly on the nature of illumination. As such in some embodiments it is preferred to reduce the degree of specular reflection by providing a filter layer 15 in the form of a light diffusing layer which will ultimately sit between the metal layer and the viewer, acting to diffuse the light reflected by the metal pattern elements $P_1$ and hence improve the light source invariance of the finished device. The light diffusing layer 15 is located between the transparent substrate 10 and the metal layer 11 and may therefore be incorporated already in the metallised substrate web provided at the start of the method. Alternatively, if the metallisation is carried out as part of the method, the light diffusing layer 15 may be applied to the substrate in an earlier step. The light diffusing layer can comprise a scattering pigment dispersed in a binder and may be coloured or colourless. The layer can be applied by coating or printing, preferably flexographic, gravure, lithographic or digital printing, and may optionally be a radiation-curable material, e.g. requiring UV-curing. In some embodiments, the appearance of the light diffusing layer 15 may be uniform across the image element array. However in other cases the light diffusing layer could comprise multiple different materials arranged as a multi-coloured pattern or image. The light-diffusing layer need not be applied with high resolution and so can be formed of multiple workings if desired.

In still further embodiments, the filter layer 15 may not be light-diffusing (i.e. optically scattering), but may comprise a clear, coloured material which can be used to modify the appearance of the metal pattern elements. For example, by providing a filter layer 15 having an orange/brown tint in combination with a metal layer 11 of aluminium, the metal takes on the appearance of copper. The tinted filter layer 15 could be applied to selected regions only (optionally with a clear colourless layer in other areas) to give a bimetallic effect.

The filter layer 15 will typically not be soluble in the etchant used in step S106 and so will typically remain across the whole image array once the metal layer 11 has been patterned, as shown in FIG. 7(a). If the filter layer is sufficiently translucent such that a contrast can still be observed between the first and second pattern elements $P_1$, $P_2$, this may be acceptable and the light diffusing layer may remain across both sets of elements in the final array. However, generally it is preferred to remove the filter layer 15 from the second pattern elements and this can be achieved by applying a suitable further etchant in which the filter is soluble. The result is shown in FIG. 7(b). A colour layer 13 can then be applied if desired, followed by an optional backing layer 14 (both as described above), as shown in FIG. 7(c).

Since the filter layer 15 is backed up by metal layer 11, it is not required to be of high optical density, although it should act to diffuse and/or to tint or selectively absorb and reflect different colours. Consequently the filter layer 15 can be made thin and this is preferred in order to minimise undercutting during etching. Preferably, the thickness of the filter layer 15 should be equal to or less than the minimum dimension (e.g. line width) of the pattern elements $P_1$, $P_2$, more preferably half that dimension or less. For example, if the pattern elements $P_1$ or $P_2$ have a dimension of 1 micron, the filter layer should preferably be no thicker than 1 micron, more preferably no thicker than 0.5 microns.

Like the (optional) filter layer 15, the colour layer 13 may have a uniform appearance across the array, or at least a zone of the array in which it is provided, in which case the finished image element array will be duotone (unless a multi-coloured light diffusing layer is provided). This will be desirable in certain types of security device. However, to increase the complexity and security level of the device, it is preferred that the colour layer 13 comprises multiple zones each comprising different optically detectable substances, e.g. being of different visible colours. The arrangement of different zones may be highly complex, e.g. representing a photograph, or may comprise a simpler arrangement of larger distinct zones. Preferably the colour layer 13 displays an image or indicia (e.g. letters, numbers or symbols) either through the relative arrangement of the zones and/or by the periphery of the whole colour layer (i.e. the combined periphery of the zones). In the ensuing examples, different zones of the colour layer 13 will be described for simplicity as having different "colours" but as noted above whilst in preferred cases these will be different visible colours, this is not essential as the optically detectable substances could be machine readable only. The term "colour" is also intended to include achromatic appearances such as black, grey, white, silver etc., as well as red, green, blue, cyan, magenta, yellow etc.

FIG. 8(a) shows an embodiment of an image element array formed using the method described above in relation to FIGS. 6(a) to 6(e) (omitting the provision of a backing layer), in which the colour layer 13 comprises two zones 13a, 13b of different colours. In this case, each zone is significantly larger than the dimensions of the pattern elements $P_1$, $P_2$, as is preferred for use in moiré magnifier and integral imaging devices to avoid the colours of adjacent zones being "averaged" together by the synthetic magnification mechanism. In zone 13a, the second pattern elements $P_2$ possess a first colour, provided by the colour layer 13, and in zone 13b, the second pattern elements $P_2$ possess a second colour. In preferred examples, the pattern defined by metal layer 11 comprises an array of negative microimages; that is, the second pattern elements $P_2$ take the form of the microimages and the metallic first pattern elements $P_1$ provide the surrounding background (in practice this may be a single contiguous area rather than multiple distinct elemental areas). Hence, the microimages have a first colour in zone 13a and a second different colour in zone 13b. Preferably each of the zones is sufficiently large so as to encompass a plurality of the microimages—generally at least 10 but in many cases tens or hundreds of the microimages. The individual microimages will be small such that they cannot be resolved by the naked eye (in the absence of focusing elements), whereas the colour layer zones are preferably sufficiently large to be discernible by eye without magnification. For example, each microimage may have an overall lateral dimension of between 15 and 30 microns, whilst each zone may have dimensions of the order of millimetres, e.g. 2 to 3 mm or larger. Examples of visual effects which can be achieved using colour layers of this sort will be described below.

Figure 8B:
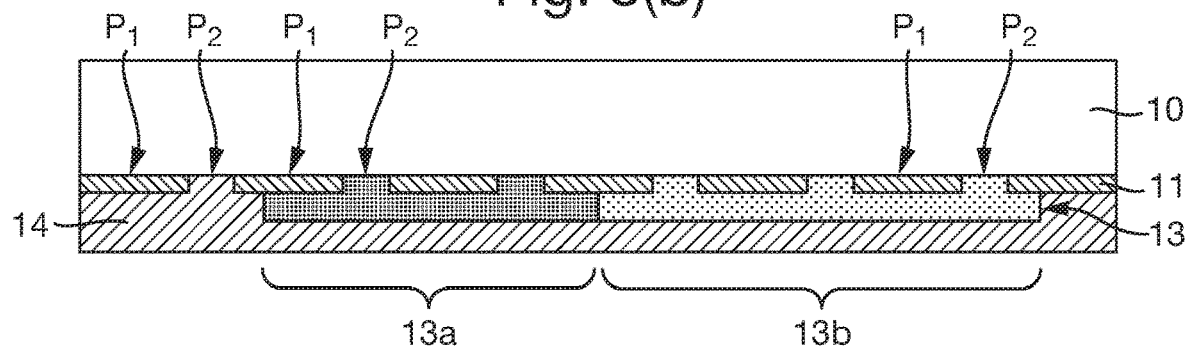

In the example shown in FIG. 8(a) the colour layer 13 extends across the whole image element array. However this is not essential and in other preferred examples the colour layer may not cover the whole array, e.g. so as to define indicia by way of its periphery. Second pattern elements $P_2$ falling outside the colour layer 13 may remain transparent. Alternatively, if a backing layer 14 is provided this may extend beyond the colour layer 13 as shown in FIG. 8(b). The backing layer 14 may have an appearance similar to that of the metal layer 11, particularly if they are both metal layers, in which case the contrast between the first and second pattern elements $P_1$, $P_2$ may be diminished or eliminated in areas outside the colour layer. This can be made use of to produce particular visual effects as will be exemplified below.

An embodiment of a security device will now be described with reference to FIGS. 9 and 10. In this case the security device is a moiré magnifier, comprising an image element array defining an array of microimages and an overlapping focussing element array with a pitch or rotational mismatch as necessary to achieve the moiré effect. FIGS. 9(a), (b) and (c) depict parts of the image element array as it would appear without the overlapping focusing element array, i.e. the non-magnified microimage array (but shown at a greatly increased scale for clarity). In contrast, FIGS. 10(a) and (b) depict the appearance of the same portion of the completed security device, i.e. the magnified microimages, seen when viewed with the overlapping focussing element array, at two different viewing angles.

In this example, the microimage array is formed using the methods described above and has a cross section corresponding substantially to that shown in FIG. 8(a). FIG. 9(a) shows the patterned metal layer 11 in plan view and it will be seen that the second pattern elements $P_2$ form a regular array of microimages 31a which here each convey the digit "5". In this case all of the microimages are of identical shape and size. The metallic first pattern elements $P_1$ form a contiguous, uniform background surrounding the microimages. FIG. 9(b) shows a colour layer 13 which is applied over the metal layer 11 as shown in FIG. 8(a). The location and size of the microimages 31a defined in the metal layer 11 is illustrated in dashed lines, but it will be appreciated that these are not present in the colour layer 13 itself. The colour layer 13 comprises a plurality of zones of which two 13a, 13b are shown, of different colours. A boundary between adjacent zones is represented at 13'. Each zone has dimensions substantially larger than those of the individual microimages 31a as described above. For example the dimensions $D_1$, $D_2$ of zone 13a may be of the order of several millimetres in each direction.

FIG. 9(c) shows the completed image element array 31 comprising the metal layer 11 and the colour layer 13 in combination, as viewed through substrate 10. The position and size of part of a focusing element array 33 to be arranged overlapping the image element array 31 is shown in dashed lines. The microimages 31a in zone 13a appear in a first colour (here represented as black), whilst those in zone 13b appear in a second colour (here represented as white). It should be noted that it is not essential to form the image array shown in FIG. 9(c) using the previously disclosed method and other techniques of forming fine-line, high resolution patterns could be used instead to achieve the desired final appearance. For example, if a sufficiently high resolution printing technique is available, the arrangement depicted in FIG. 9(c) could be laid down wholly by printing, e.g. in several workings. Alternatively the microimages could be formed as described in WO-A-2005052650 and then combined with a colour layer.

FIG. 10(a) shows the completed security device 30, i.e. the image element array 31 shown in FIG. 9(c) plus an overlapping focusing element array 33, from a first viewing angle which here is approximately normal to the plane of the device 30. It should be noted that the security device is depicted at the same scale as used in FIG. 9(c): the apparent enlargement is the effect of the focusing element array 33 now included. The moiré effect acts to magnify the microimage array such that magnified versions of the microimages 31a are displayed. In this example just two of the magnified microimages 34a, 34b are shown. In practice, the size of the enlarged images and their orientation relative to the device will depend on the degree of mismatch between the focussing element array. This will be fixed once the focusing element array is joined to the image element array.

It will be seen that each zone 13a, 13b covers an area at least as large as that occupied by one magnified microimage 34a, 34b. That is, in this case each microimage 34 occupies an area of approximately $M_1 \times M_2$, where $M_1$ and $M_2$ represent the maximum height and width of the microimage. It will be noted that this area occupied by the microimage includes not only the area falling inside the linewidth of the digit "5" but also portions of its surroundings which are at least partially bounded by the microimage. Hence the area $D_1 \times D_2$ of the zone 13a is preferably greater than or equal to the area $M_1 \times M_2$ of the magnified microimage. In addition, the lateral dimensions of the zone 13a are preferably greater than or equal to the dimensions of the microimage in the corresponding directions, i.e. in the y-axis, $D_1$ is greater than $M_1$ and in the x-axis, $D_2$ is greater than $M_2$. It will be appreciated that since all of the magnified microimages 34 will be of the same size as one another, the above relationship does not have to be defined between any one zone and a magnified microimage falling wholly within it: indeed, as discussed below the magnified images move upon tilting such that it may not be possible to assign each magnified image to a particular zone. Rather, it is preferred that each of the zones 13a, 13b fulfil the above requirements relative to any one of the magnified microimages.

Figure 10B:
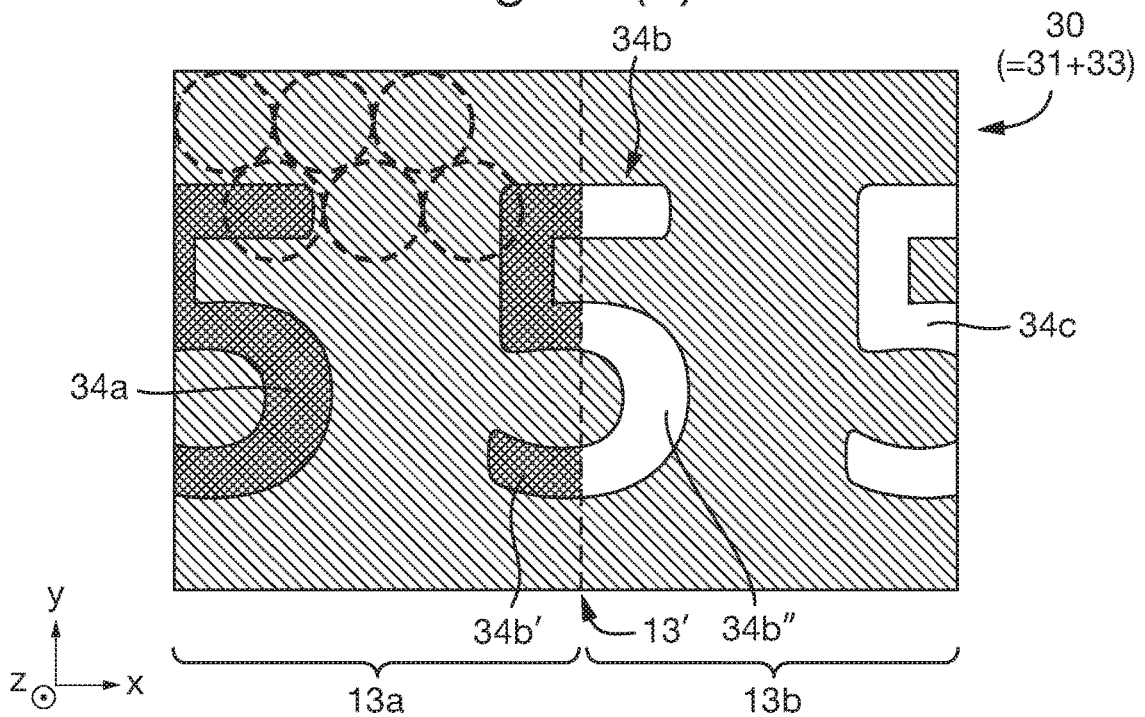

The described relationship between the zones of the colour layer and the size of the magnified images results in particularly striking visual effects. Since each zone is sufficiently large to cover enough microimages to form one magnified microimage, at at least one viewing angle the magnified image will have the same colour appearance (supplied by one zone of the colour layer) across its whole extent. Upon tilting (i.e. changing the viewing angle), the magnified microimages 34 appear to move relative to the device as is known in conventional moiré magnifier devices. However, provided the colour zones 13a, 13b are not overly large, in the present device one or more of the magnified microimages will encounter a boundary 13' between zones, as shown in FIG. 10(b). This will give the appearance of the magnified image progressively changing colour from that of the first zone 13a to that of the second zone 13b. Depending on the size of the zones and the degree of tilt, the whole area of the magnified image may not change colour but rather different portions 34b', 34b" may appear in different colours as in the illustration of FIG. 10(b), which also shows a third magnified microimage of the array 34c that has become visible on tilting.

To achieve this effect, the zones of the colour layer are sized such that the set of (one or more) zones contributing to a magnified microimage changes to a different set within an achievable tilt angle, which must be less than 90 degrees but preferably is 50 degrees or less, more preferably 30 degrees or less. At a first viewing angle, a first set of one or more zones contributes to the magnified microimage—in the FIG. 10 device, taking magnified microimage 34a as an example, the first set of zones contributing to its appearance at the viewing angle shown in FIG. 10(a) comprises zone 13a only. At a second viewing angle, a second, different set of one or more zones contributes to the appearance of the same microimage—in this case at the viewing angle shown in FIG. 10(b) the second set comprises zone 13a and zone 13b resulting in a two colour appearance of the magnified image as already described.

In practice, good effects have been achieved in cases where the zones are each no larger than the area occupied by two adjacent magnified microimages 34, denoted by the dash-dot outline in FIG. 10(a) and having dimensions of $M_1 \times M_3$. Zone sizes of this sort assist in ensuring that a significant number of the magnified microimages will encounter a zone boundary, and hence undergo a colour change, within reasonable tilt angles. It is has also been found preferable to array the colour zones with substantially the same periodicity as that of the magnified image array, for the same reasons.

A further example of a moiré magnifier security device operating on the same principles is shown in FIGS. 11(a), (b) and (c) which depict the appearance of the device from three different viewing angles. Again, the Figures show the magnified image array, i.e. as viewed with the focusing element array in place. The metal layer 11 is depicted as semi-translucent in order to see the colour layer 13 behind, but in practice this will not be the case and the metal layer will be opaque as previously described. It will be seen that the colour layer 13 comprises an array of approximately square zones, some of which are labelled 13a to 13h. A selection of the magnified microimages, each depicting the digit "5" are shown, three of which labelled 34x, 34y and 34z will be used as examples. It will be seen that the area of each colour layer is larger than the area occupied by any one of the magnified images of the digit "5", but no greater than the area occupied by two adjacent images (including the space between them).

Taking the magnified image 34x as a first example, in FIG. 11(a) where the device is viewed substantially along its normal, the whole of the magnified image is located inside zone 13a and therefore is displayed with a single colour corresponding to that of zone 13a, which is white in this example. Upon tilting the device to the right, the appearance of the device changes to that shown in FIG. 11(b). It will be seen that magnified image 34x is now predominantly black, since the microimages forming the major part of the magnified image are now taken from zone 13b, although a small portion of the right-most side of the image remains white since the microimages contributing to this portion are in zone 13a. At some intermediate tilt angle (between those depicted in FIGS. 11(a) and (b)) the image 34x will have appeared half white and half black. When the device is tilted to the left, as shown in FIG. 11(c), the same microimage once more appears white, which is the colour of zone 13a. In this case the different sets of zones contributing to the magnified image 34x at the first and last viewing angles shown each comprise a single zone, whereas in the second viewing angle shown (FIG. 11(b)), the set comprises two zones (13a and 13b).

In the case of magnified image 34y, more than one zone contributes to its appearance at each of the three viewing angles shown, giving the effect that the image is located at a boundary between several zones. When viewed along the normal (FIG. 11(a)), the image 34y appears to comprise two differently coloured parts, corresponding to the colours of zones 13d and 13e. When tilted to the right, a different set of four zones 13d, 13e, 13f and 13g provide the microimages contributing to the image 34y and hence the magnified image appears with four differently coloured parts. When tilted to the left the image remains two-coloured (FIG. 11(c)).

Magnified image 13z is an example of an image located outside the colour layer 13 at some tilt angles. When viewed along the normal (FIG. 11(a)) and when tilted to the right (FIG. 11(b)), the microimages contributing to image 13z comprise only those falling outside the extent of the colour layer 13, and hence the visibility of image 13z will depend on the contrast between the metal layer 11 and any background such as an opaque backing layer 14. If the contrast is low, the image 34z may be substantially invisible at such viewing angles. When tilted to the left however (FIG. 11(c)), microimages from within zone 13h of the colour layer 13 begin contributing to the image 13z, such that it takes on the colour of that zone.

The result is a multi-coloured device with a dynamically changing appearance upon tilting, which represents a significant challenge to the counterfeiter.

A further embodiment of a security device operating on the same principles is shown in FIG. 12. This depicts the appearance of the complete device, i.e. the magnified image, when viewed from the normal. In this case, the device has a cross section as shown in FIG. 8(b), incorporating a backing layer 14 which is of a similar appearance to that of the metal layer 11 and extends beyond the area covered by the colour layer 13. The colour layer 13 is arranged across an area with a periphery in the shape of a digit "5" although of course this could represent any other indicia such as a letter, number, logo, symbol or other graphic. Inside the periphery the colour layer is provided as a plurality of differently coloured zones of which a selection are labelled 13a, 13b, 13c (shown delimited by dashed lines which typically will not be present in practice). Each zone 13a, 13b, 13c . . . is larger than any one of the magnified images 34, although in this case is also slightly larger than the area occupied by two adjacent magnified images (which is a preferred but optional implementation). As the device is tilted, at least some of the magnified images 34 will appear to move from one zone to another, thereby taking on a different colour or exhibiting different parts of the image in different colours, in the same manner as previously described. Outside the periphery of colour layer 13, the magnified images 34 may or may not be visible depending on the contrast between the metal layer 11 and the backing layer 14. In preferred embodiments, these magnified images are only weakly visible, or not visible at all, such that the optical effect appears constrained to the indicia defined by the extent of the colour layer 13.

Again, whilst the image element array used in the FIG. 12 device is preferably made using the above described method, this is not essential and any other technique which arrives an image array with the same appearance could be used instead.

In the above examples of security devices, the microimages 31 are all identical to one another, such that the devices can be considered "pure" moiré magnifiers. However, the same principles can be applied to "hybrid" moiré magnifier/integral imaging devices, in which the microimages depict an object or scene from different viewpoints. Such microimages are considered substantially identical to one another for the purposes of the present invention. An example of such a device is shown schematically in FIG. 13, where FIG. 13(a) shows the unmagnified microimage array, without the effect of focusing elements 33, and FIG. 13(b) shows the appearance of the finished device, i.e. the magnified image. As shown in FIG. 13(a), the microimages 31 show an object, here a cube, from different angles. It should be noted that the microimages are formed as demetallised lines corresponding to the black lines of the cubes in the Figure, the remainder of the metal layer being opaque although this is shown in reverse in the Figure for clarity. A colour layer 13 is provided, here in the form of a single hexagonal zone, which provides colour to the demetallised lines and is concealed by the metal layer elsewhere. Outside the colour layer 13, the microimages may in practice not be visible due to a lack of contrast between the metal layer 11 and a backing layer 14 as previously mentioned. In the magnified image (FIG. 13(b)), the moiré effect generates magnified, 3D versions of the cube labelled 34. In reality, only those lines of the magnified cubes 34 which coincide with the colour layer 13 will be visible whilst those portions outside the coloured zone will be invisible or only weakly visible. As the device is tilted the magnified cubes 34 will appear to move across the device and so enter or leave the coloured zone 13 depending on their location and the degree of tilt. This gives the visual impression of the magnified images appearing and disappearing as they move across the central portion of the device. This, combined with the 3D appearance of the images, amounts to an effect with significant visual impact.

FIG. 14 depicts a further embodiment of a security device 40, which here is a lenticular device. A transparent substrate 10 is provided on one surface with an array of focussing elements 43, here in the form of cylindrical lenses, and on the other surface with an image element array preferably formed of a patterned metal layer 11 and colour layer 13 as described above. The image array comprises first pattern elements $P_1$, and second pattern elements $P_2$. The size and shape of each first pattern element $P_1$ is substantially identical. The pattern elements in this example are elongate image strips and so the overall pattern of elements is a line pattern, the elongate direction of the lines lying substantially parallel to the axial direction of the focussing elements 43, which here is along the y-axis. The lateral extent of the pattern (including its elements $P_1$ and $P_2$) is referred to as the array area.

As shown best in the cross-section of FIG. 14(*b*), the pattern formed in metal layer 11 and the focussing element array have substantially the same periodicity as one another in the x-axis direction, such that one first pattern element $P_1$ and one second pattern element $P_2$ lies under each lens 43. In this case, as is preferred, the width w of each element $P_1$, $P_2$ is approximately half that of the lens pitch. Thus approximately 50% of the array area carries first pattern elements $P_1$ and the other 50% corresponds to second pattern elements $P_2$. In this example, the image array is registered to the lens array 43 in the x-axis direction (i.e. in the arrays' direction of periodicity) such that a first pattern element $P_1$ lies under the left half of each lens and a second pattern element $P_2$ lies under the right half. However, registration between the lens array 43 and the image array in the periodic dimension is not essential.

The colour layer 13 can take any form, including that of a complex, multi-coloured image such as a photograph.

When the device is viewed by a first observer $O_1$ from a first viewing angle, each lens 43 will direct light from its underlying first pattern element $P_1$ to the observer, with the result that the device as a whole appears as a uniform metallic region across the array area, as illustrated in FIG. 14(*d*). This is referred to more generally as image $I_1$ since in other examples if a patterned light-diffusing layer were provided over the metal layer (as described in previous embodiments), the first pattern elements $P_1$ may collectively display any image according to that provided by the light-diffusing layer. When the device is tilted so that it is viewed by second observer $O_2$ from a second viewing angle, now each lens 43 directs light from the second pattern elements $P_2$ to the observer. As such the whole array area now exhibits the appearance of the colour layer 13, which in this case carries a star shaped image as shown in FIG. 14(*c*), which constitutes an image $I_2$. Hence, as the security device is tilted back and forth between the positions of observer $O_1$ and observer $O_2$, the appearance of the device switches between image $I_1$ and image $I_2$.

In order to achieve an acceptably low thickness of the security device (e.g. around 70 microns or less where the device is to be formed on a transparent document substrate, such as a polymer banknote, or around 40 microns or less where the device is to be formed on a thread, foil or patch), the pitch of the lenses must also be around the same order of magnitude (e.g. 70 microns or 40 microns). Therefore the width of the pattern elements is preferably no more than half such dimensions, e.g. 35 microns or less.

Two-dimensional lenticular devices can also be formed, in which the optically variable effect is displayed as the device is tilted in either of two directions, preferably orthogonal directions. Examples of patterns suitable for forming image arrays for such devices include forming the first pattern elements $P_1$ as grid patterns of "dots", with periodicity in more than one dimension, e.g. arranged on a hexagonal or orthogonal grid. For instance, the first pattern elements $P_1$ may be square and arranged on an orthogonal grid to form a "checkerboard" pattern with resulting square second pattern elements $P_2$ in which the colour layer 13 is visible. The focusing elements in this case will be spherical or aspherical, and arranged on a corresponding orthogonal grid, registered to the image array in terms of orientation but not necessarily in terms of translational position along the x or y-axes. If the pitch of the focussing elements is the same as that of the image array in both the x and y directions, the footprint of one focussing element will contain a 2 by 2 array of pattern elements. From an off-axis starting position, as the device is tilted left-right, the displayed image will switch as the different pattern elements are directed to the viewer, and likewise the same switch will be exhibited as the device is tilted up-down. If the pitch of the focusing elements is twice that of the image array, the image will switch multiple times as the device is tilted in any one direction.

Similar effects can be achieved with other two dimensional arrays of pattern elements, e.g. using first pattern elements $P_1$ which are circular rather than square. Any other "dot" shape could alternatively be used, e.g. polygonal. The patterns could of course be reversed such that it is the first pattern elements define the surroundings of negative "dots" in which the colour layer 13 is visible.

Lenticular devices can also be formed in which the two or more images (or "channels") displayed by the device at different angles do not correspond exclusively to the first pattern elements on one hand and the second pattern elements on the other. Rather, both pattern elements are used in combination to define sections of two or more images, interleaved with one another in a periodic manner. Thus, in an example the first pattern elements may correspond to the black portions of a first image and those of a second image, whilst the second pattern elements may provide the white portions of the same images. Of course the images need not be black and white but could be defined by any other pair of colours with sufficient contrast. Sections of the first and second images are interleaved with one another in a manner akin to the pattern of lines shown in FIG. 14. When the device is tilted the two images will be displayed over different ranges of angles giving rise to a switching effect. More than two images could be interleaved in this way in order to achieve a wide range of animation, morphing, zooming effects etc. In embodiments such as these the colour layer 13 preferably has a uniform appearance (e.g. single colour) across the array as does any light-diffusion layer provided resulting in a duo-tone appearance.

In all of the above examples of security devices, a focusing element array is employed to co-operate with the image element array to generate the optically variable effect. However, this is not essential and FIG. 15 shows some examples of security devices with image element arrays made using the above described methods which do not require focussing element arrays. In these examples, two image element arrays are manufactured using the above-described methods, one on each surface of the substrate 10, as will be described further below with reference to FIG. 16. However in each case it will be appreciate that just one or other of the described image arrays 11a, 11b need be formed using this technique and the other could be formed using any other available method, e.g. printing.

FIG. 15(a) shows a security device 20 which operates on similar principles to those of the lenticular device described above with respect to FIG. 14, but utilising two demetallised image element arrays 11a, 11b rather than a single image element array combined with a focusing element array. In this case, one image element array 11a formed on a first surface of transparent substrate 10 forms a masking grid of metal lines $P_1$ spaced by gaps $P_2$, whilst the other image element array 11b formed on the second surface of transparent substrate 10 exhibits a pattern comprising a sequence of image components, labelled A, B, C, etc. Each of the complete images A, B, C, etc from which the image elements are taken is shown under the cross-section of the device and it will be seen that these comprise a sequence of animation steps depicting a star symbol changing in size. To create the pattern formed in metal layer 11b, the five images A to E are split into elements or "slices" and interleaved with one another so that a slice of image A is positioned next to a slice of image B, which in turn is positioned next to a slice of image C, and so forth. The resulting pattern is formed on a mask and transferred to a resist layer 12 on metal layer 11b in the manner described above, before etching as appropriate. On the opposite side of transparent substrate 10, a masking grid is formed by patterning metal layer 11a using the same method via a different patterned mask resulting in a spaced array of visually opaque lines $P_1$ with intervening transparent portions $P_2$ through which the pattern in metal layer 11b may be viewed.

The device could be designed to be viewed in reflected or transmitted light. Transmitted light is preferred since the contrast in the image can generally be perceived more clearly and in addition the same visual effect can be viewed from both sides of the device. When the device is viewed from above the masking grid 11a, at any one instant, the image slices from only one of the images A to E are visible. For example, in the configuration shown in FIG. 15(a), when the device is viewed straight-on, only the image slices forming image E will be visible, and thus the device as a whole will appear to exhibit a complete reproduction of image E. Provided the dimensions of the device are correctly selected, when the device is observed from different angles, different images will become visible. For example, when the device is viewed from position A, only the image slices forming image A will be visible through the masking grid 11a, the device as a whole whereby exhibiting the complete image A. Similarly, when the device is viewed from position C only the image slices forming image C will be visible. As such, as the device is tilted and the viewer observes it at different angles, different stages of the animation will be seen and, provided the images are printed in the correct sequence, an animation will be perceived. In the present example this will appear as a star symbol increasing or decreasing as the device is tilted. Thus, in this case the animation is perceived as a zooming in and out but in other cases the images could be arranged to depict, for example, perceived motion (e.g. a horse galloping), morphing (e.g. a sun changing into a moon) or perceived 3D depth (by providing multiple images of the same object, but from slightly different angles). Of course, in other examples, fewer images (e.g. 2) could be interleaved resulting in a "switch" from one image to another at certain tilt angles, rather than an animation effect.

In order to achieve this effect, the width of each image slice, X, must be smaller than the thickness, t, of the transparent support layer 10, preferably several times smaller, such that there is a high aspect ratio of the thickness t to image slice width X. This is necessary in order that a sufficient portion of the pattern on metal layer 11b can be revealed through tilting of the device. If the aspect ratio were too low, it would be necessary to tilt the device to very high angles before any change in image will be perceived. In a preferred example, each image slice has a width X of the order of 5 to 10 μm, and the thickness t of the support layer 10 is approximately 25 to 35 μm. The use of the above-described demetallisation process to form the pattern 11b is therefore particularly advantageous since the high resolution nature of the process allows the formation of image elements at these small dimensions.

The dimensions of the masking grid 11a are generally larger than those of the pattern elements 11b, requiring opaque stripes of width ((n−1)X) where n is the number of images to be revealed (here, five), spaced by transparent regions of approximately the same width as that of the image slices (X). Thus, in this example the opaque regions $P_1$ of the masking grid 11a have a width of around 20 to 40 μm and hence could alternatively be produced using conventional techniques such as printing.

FIG. 15(b) shows a further embodiment of a venetian blind-type security device in cross-section, comprising first and second patterned metal layers 11a and 11b positioned on either surface of a transparent substrate 10. Metal layer 11a has been demetallised according to a first pattern $P_a$ whereas metal layer 11b has been exposed to a second pattern $P_b$. In this example, the device has two laterally offset regions A and B. In region A, the exposed pattern elements of pattern $P_a$ and pattern $P_b$ are identical and aligned with one another. In area B the patterns $P_a$ and $P_b$ are identical in pitch but 180° out of phase with one another such that the remaining regions of the first metal layer 11a forming pattern $P_a$ align with the removed regions of the second metal layer 11b forming second pattern $P_b$, and vice versa.

When viewed in transmission from directly above, observer (i) will perceive region A as having a lower optical density than region B where light transmission is blocked by the interplay between the two patterns. In contrast, when viewed from an angle at the position of observer (ii), area A will appear relatively dark compared with area B, since light will now be able to pass through aligned transparent regions of patterns $P_a$ and $P_b$ in area B, whereas it will be blocked by the alignment between pattern elements in area A. This "contrast flip" between areas A and B provides an easily testable, distinctive effect. In order for the switch to be observable at relatively low tilt angles, the aspect ratio of the support layer thickness relative to the spacing of the pattern elements should again be at least one-to-one. It should be noted that it is not essential to ensure an entirely accurate registration between the two patterns $P_a$ and $P_b$ since provided the sizing of the pattern elements is correct, a switch in contrast between the two regions will still be visible as the device is tilted.

FIG. 15(c) shows a further embodiment of a security device in cross-section which here takes the form of a moiré interference device. In this embodiment, two patterned metal layers 11a, 11b are provided as on either side of transparent substrate 10 but as in the previous embodiments, one or other of the patterns provided by the metal layers could be provided by other means such as printing.

To form a moiré interference device, each of the metal layers 11a, 11b carries a pattern of elements, mismatches between the two patterns combining to form moiré interference fringes. In the example shown, each of the patterns $P_a$ and $P_b$ consists of an array of line elements, with those of one pattern rotated relative to those of the other. In other cases, the mismatch could be provided by a pitch variation rather than a rotation, and/or isolated distortions within one or other of the patterns. When viewed from above such that the two patterns are viewed in combination with one another, moiré interference bands are visible and these will appear to move relative to the device depending on the viewing angle. This is due to the precise portions of the two patterns which appear to overlap changing as the viewing angle changes. For instance, in the example of FIG. 25, when viewed directly from above, portion a of pattern $P_a$ will appear to overlap and therefore interfere with portion b of pattern $P_b$, whereas at a second viewing angle illustrated by observer (ii), the same portion a of pattern $P_a$ will appear to overlap and therefore interfere with a different portion c of the second pattern $P_b$. In order to achieve significant perceived motion at relatively low viewing angles, a high aspect ratio of the spacing between the two patterns (represented by the thickness t of support layer 10) relative to the spacing s of the line elements in each of the patterns is required. For example, where the line elements have a width and spacing of around 5 μm, a thickness t of around 25 μm is suitable. No registration between the two patterns $P_a$ and $P_b$ is required.

The security device structures shown in FIGS. 15(a), (b) and (c) are preferably formed by carrying out the above-described demetallisation method on both sides of a transparent substrate. FIG. 16(a) shows a first example of apparatus which may be used to produce both patterned metal layers. As shown, the substrate web S provided in step S101 may include a second metal layer 11b located on the second surface of the substrate 10, which may be of the same composition as the first metal layer 11a, or may be different. Preferably, however, the second metal layer 11b is soluble in the same etchant substance as the first metal layer 11a. A second photosensitive resist layer 12b is applied over the second metal layer 11b and again this may be of the same composition as the first photosensitive resist layer 12a or may be different. In the FIG. 16(a) embodiment, both resist layers 12a, 12b are then exposed simultaneously to radiation through respective patterned masks 5a, 5b each carrying a pattern $P_a$, $P_b$ of opaque and transparent elements in the manner previously described. The two patterns $P_a$, $P_b$ may be the same as one another or different, and/or may be laterally offset from one another (in the transport path direction and/or in the orthogonal direction), depending on the desired optical effect. In this example the two masks 5a, 5b are shown supported on respective opposing rollers in a manner correspond to that described above in relation to FIG. 5(a) but alternatively one or both of the masks 5a, 5b could be provided in the form of a belt as shown in FIG. 5(b). For example, roller 9 of FIG. 5(b) could be a patterning mask as shown in FIG. 5(a) carrying pattern $P_a$ whilst pattern $P_b$ is carried on the belt 5 supported on rollers 5' as shown.

Figure 16B:
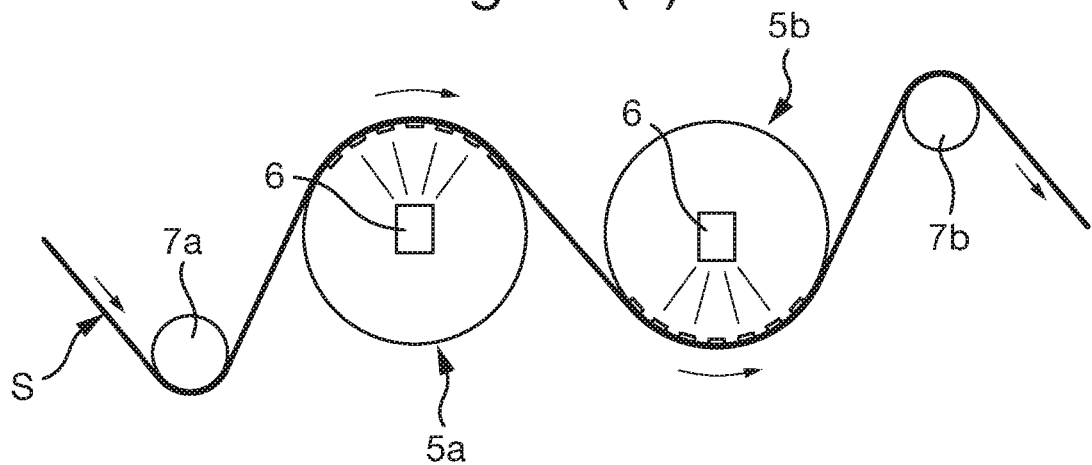

Alternative apparatus for patterning metal layers 11a, 11b on both sides of a transparent substrate is shown in FIG. 16(b). Here the two resist layers 12a, 12b are exposed sequentially rather than simultaneously but still preferably in register with one another. In this case, a second patterning roller 5b is positioned downstream of a first patterning roller 5a with the transport path arranged to include a portion of the circumferential surface of both patterning rollers 5a, 5b. Sequential exposure in this way may not achieve the same levels of registration between the two patterns as in the FIG. 16(a) embodiment, but may reduce the risk of slippage occurring between the masks and the substrate web S.

In still further examples, security devices including those discussed above in relation to FIG. 15 could be formed by producing two demetallised image element arrays on separate transparent substrates 10 using the above described method, and then laminating them together such that the two metal layers are spaced apart by the two transparent substrates.

Security devices of the sorts described above are suitable for forming on security articles such as threads, stripes, patches, foils and the like which can then be incorporated into or applied onto security documents such as banknotes and examples of this will be provided further below. However the security devices can also be constructed directly on security documents which are formed of a transparent document substrate, such as polymer banknotes. In such cases, the image element array may be manufactured on a first substrate, using the method discussed above, and then transferred onto or affixed to one surface of the document substrate, optionally using a transparent adhesive. This may be achieved by foil stamping, for example. An exemplary structure is shown in FIG. 17 where substrate 46 is the transparent document substrate, e.g. BOPP, and layer 47 is an adhesive used to join the image array comprising metal layer 11, colour layer 13 and backing layer 14 (all formed previously) to the substrate. Alternatively, the demetallised pattern array could be formed directly on the document substrate 46 by providing a metal layer on the surface of the substrate 46 (optionally across selected portions only), and performing the above-described method on substrate 46 to form an image element array thereon. Focusing element array 48 can be applied to the opposite side of document substrate 46, e.g. by embossing or cast-curing, before or after the image element array is applied.

Security devices of the sorts described above can be incorporated into or applied to any product for which an authenticity check is desirable. In particular, such devices may be applied to or incorporated into documents of value such as banknotes, passports, driving licences, cheques, identification cards etc. The image array and/or the complete security device can either be formed directly on the security document (e.g. on a polymer substrate forming the basis of the security document) or may be supplied as part of a security article, such as a security thread or patch, which can then be applied to or incorporated into such a document.

Such security articles can be arranged either wholly on the surface of the base substrate of the security document, as in the case of a stripe or patch, or can be visible only partly on the surface of the document substrate, e.g. in the form of a windowed security thread. Security threads are now present in many of the world's currencies as well as vouchers, passports, travellers' cheques and other documents. In many cases the thread is provided in a partially embedded or windowed fashion where the thread appears to weave in and out of the paper and is visible in windows in one or both surfaces of the base substrate. One method for producing paper with so-called windowed threads can be found in EP-A-0059056. EP-A-0860298 and WO-A-03095188 describe different approaches for the embedding of wider partially exposed threads into a paper substrate. Wide threads, typically having a width of 2 to 6 mm, are particularly useful as the additional exposed thread surface area allows for better use of optically variable devices, such as that presently disclosed.

The security article may be incorporated into a paper or polymer base substrate so that it is viewable from both sides of the finished security substrate at at least one window of the document. Methods of incorporating security elements in such a manner are described in EP-A-1141480 and WO-A-03054297. In the method described in EP-A-1141480, one side of the security element is wholly exposed at one surface of the substrate in which it is partially embedded, and partially exposed in windows at the other surface of the substrate.

Base substrates suitable for making security substrates for security documents may be formed from any conventional materials, including paper and polymer. Techniques are known in the art for forming substantially transparent regions in each of these types of substrate. For example, WO-A-8300659 describes a polymer banknote formed from a transparent substrate comprising an opacifying coating on both sides of the substrate. The opacifying coating is omitted in localised regions on both sides of the substrate to form a transparent region. In this case the transparent substrate can be an integral part of the security device or a separate security device can be applied to the transparent substrate of the document. WO-A-0039391 describes a method of making a transparent region in a paper substrate. Other methods for forming transparent regions in paper substrates are described in EP-A-723501, EP-A-724519, WO-A-03054297 and EP-A-1398174.

The security device may also be applied to one side of a paper substrate, optionally so that portions are located in an aperture formed in the paper substrate. An example of a method of producing such an aperture can be found in WO-A-03054297. An alternative method of incorporating a security element which is visible in apertures in one side of a paper substrate and wholly exposed on the other side of the paper substrate can be found in WO-A-2000/39391.

Examples of such documents of value and techniques for incorporating a security device will now be described with reference to FIGS. 18 to 21.

FIG. 18 depicts an exemplary document of value 50, here in the form of a banknote. FIG. 18a shows the banknote in plan view whilst FIG. 18b shows a cross-section of the same banknote along the lines X-X'. In this case, the banknote is a polymer (or hybrid polymer/paper) banknote, having a transparent substrate 51. Two opacifying layers 53 and 54 are applied to either side of the transparent substrate 51, which may take the form of opacifying coatings such as white ink, or could be paper layers laminated to the substrate 51.

The opacifying layers 53 and 54 are omitted across a selected region 52 forming a window within which a security device is located. In FIG. 18(b), the security device is disposed within window 52, with a focusing element array 48 arranged on one surface of the transparent substrate 51, and image element array 11 on the other (e.g. as in FIG. 17 above). As described in relation to FIG. 17, the image element array 11 could be manufactured on a separate substrate which is then laminated to the document substrate 51 in the window region, or could be manufactured directly on the document substrate 51 by metallising the substrate 51 (at least in the window region 52, optionally all over the substrate) and then forming a demetallised pattern in the metal layer using the above-described method.

It will be appreciated that, if desired, the window 52 could instead be a "half-window", in which one of the opacifying layers (e.g. 53 or 54) is continued over all or part of the image array 11. Depending on the opacity of the opacifying layers, the half-window region will tend to appear translucent relative to surrounding areas in which opacifying layers 53 and 54 are provided on both sides.

In FIG. 19 the banknote 50 is a conventional paper-based banknote provided with a security article 55 in the form of a security thread, which is inserted during paper-making such that it is partially embedded into the paper so that portions of the paper 56 lie on either side of the thread. This can be done using the techniques described in EP0059056 where paper is not formed in the window regions during the paper making process thus exposing the security thread 55 in window regions 57 of the banknote. Alternatively the window regions 57 may for example be formed by abrading the surface of the paper in these regions after insertion of the thread. It should be noted that it is not necessary for the window regions 57 to be "full thickness" windows: the thread 55 need only be exposed on one surface if preferred. The security device is formed on the thread 55, which comprises a transparent substrate a focusing array 21 provided on one side and an image array 11 provided on the other. Windows 57 reveal parts of the device, which may be formed continuously along the thread. Alternatively several security devices could be spaced from each other along the thread, with different or identical images displayed by each.

In FIG. 20, the banknote 50 is again a conventional paper-based banknote, provided with a strip element or insert 58. The strip 85 is based on a transparent substrate and is inserted between two plies of paper 56a and 56b. The security device is formed by a lens array 21 on one side of the strip substrate, and an image array 11 on the other. The paper plies 56a and 56b are apertured across region 59 to reveal the security device, which in this case may be present across the whole of the strip 58 or could be localised within the aperture region 59. It should be noted that the ply 56a need not be apertured and could be continuous across the security device.

Figure 21A:
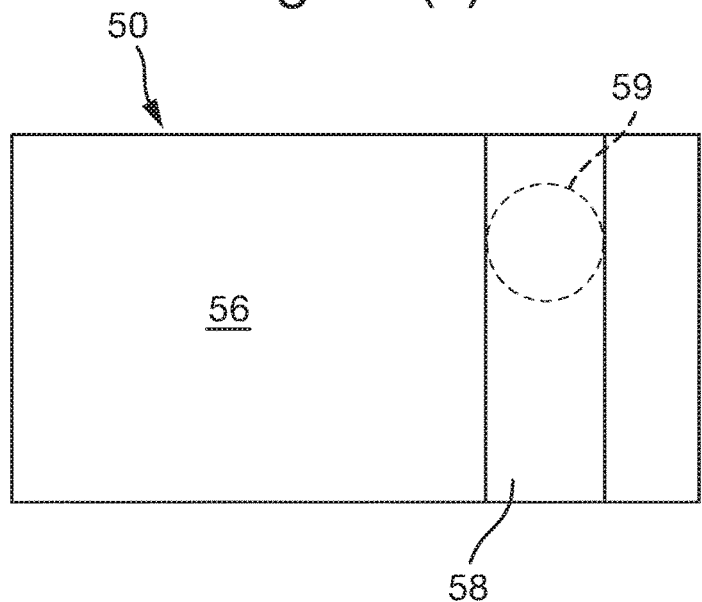
Figure 21C:
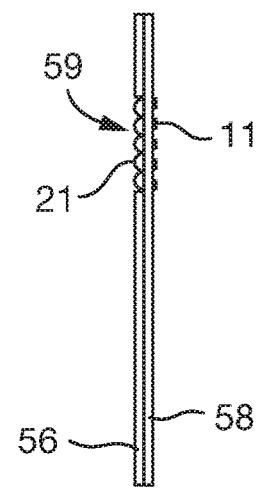
Figure 21B:
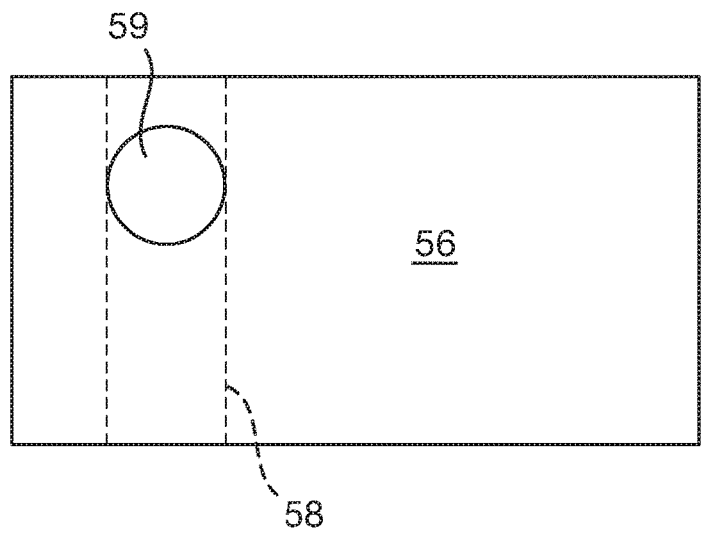

A further embodiment is shown in FIG. 210 where FIGS. 21(a) and (b) show the front and rear sides of the document 50 respectively, and FIG. 21(c) is a cross section along line Z-Z'. Security article 58 is a strip or band comprising a security device according to any of the embodiments described above. The security article 58 is formed into a security document 50 comprising a fibrous substrate 56, using a method described in EP-A-1141480. The strip is incorporated into the security document such that it is fully exposed on one side of the document (FIG. 21(a)) and exposed in one or more windows 59 on the opposite side of the document (FIG. 21(b)). Again, the security device is formed on the strip 58, which comprises a transparent substrate with a lens array 21 formed on one surface and a co-operating image array 11 as previously described on the other Alternatively a similar construction can be achieved by providing paper 56 with an aperture 59 and adhering the strip element 58 onto one side of the paper 56 across the aperture 59. The aperture may be formed during papermaking or after papermaking for example by die-cutting or laser cutting.

In still further embodiments, a complete security device could be formed entirely on one surface of a security document which could be transparent, translucent or opaque, e.g. a paper banknote irrespective of any window region. The image array 11 can be affixed to the surface of the substrate, e.g. by adhesive or hot or cold stamping, either together with a corresponding focusing element array 21 or in a separate procedure with the focusing array 21 being applied subsequently.

In general when applying a security article such as a strip or patch carrying the security device to a document, it is preferable to bond the article to the document substrate in such a manner which avoids contact between those focusing elements, e.g. lenses, which are utilised in generating the desired optical effects and the adhesive, since such contact can render the lenses inoperative. For example, the adhesive could be applied to the lens array(s) as a pattern that leaves an intended windowed zone of the lens array(s) uncoated, with the strip or patch then being applied in register (in the machine direction of the substrate) so the uncoated lens region registers with the substrate hole or window.

The security device of the current invention can be made machine readable by the introduction of detectable materials in any of the layers or by the introduction of separate machine-readable layers. Detectable materials that react to an external stimulus include but are not limited to fluorescent, phosphorescent, infrared absorbing, thermochromic, photochromic, magnetic, electrochromic, conductive and piezochromic materials.

Additional optically variable devices or materials can be included in the security device such as thin film interference elements, liquid crystal material and photonic crystal materials. Such materials may be in the form of filmic layers or as pigmented materials suitable for application by printing. If these materials are transparent they may be included in the same region of the device as the security feature of the current invention or alternatively and if they are opaque may be positioned in a separate laterally spaced region of the device.

The presence of a metallic layer in the security device can be used to conceal the presence of a machine readable dark magnetic layer, or the metal layer itself could be magnetic. When a magnetic material is incorporated into the device the magnetic material can be applied in any design but common examples include the use of magnetic tramlines or the use of magnetic blocks to form a coded structure. Suitable magnetic materials include iron oxide pigments ($Fe_2O_3$ or $Fe_3O_4$), barium or strontium ferrites, iron, nickel, cobalt and alloys of these. In this context the term "alloy" includes materials such as Nickel:Cobalt, Iron:Aluminium:Nickel:Cobalt and the like. Flake Nickel materials can be used; in addition Iron flake materials are suitable. Typical nickel flakes have lateral dimensions in the range 5-50 microns and a thickness less than 2 microns. Typical iron flakes have lateral dimensions in the range 10-30 microns and a thickness less than 2 microns.

In an alternative machine-readable embodiment a transparent magnetic layer can be incorporated at any position within the device structure. Suitable transparent magnetic layers containing a distribution of particles of a magnetic material of a size and distributed in a concentration at which the magnetic layer remains transparent are described in WO03091953 and WO03091952.

Negative or positive indicia visible to the naked eye may additionally be created in the metal layer 11 or in any suitable opaque layer, e.g. backing layer 14, either inside or outside the image element array area.

The invention claimed is:

1. A security device comprising:
    a transparent substrate;
    a focusing element array disposed on the transparent substrate, the focusing element array defining a focal plane; and
    an image element array disposed on the transparent substrate, the image element array defining an array of microimages against a background, the image element array being located in a plane substantially coincident with the focal plane of the focusing element array, the focusing element array and the array of microimages being relatively disposed on the transparent substrate and having relative pitches such that the focusing element array and the array of microimages are configured to together generate a magnified version of the array of microimages due to the moiré effect, the image element array including:
    a patterned layer of opaque material, the array of microimages being defined by an absence of the opaque material and the background being defined by a presence of the opaque material, the patterned layer of opaque material including a metal layer or a metal alloy layer; and
    a colour layer overlapping the patterned layer of opaque material, the colour layer being exposed through the patterned layer where the opaque material is absent, the colour layer including a plurality of different optically detectable materials in a respective plurality of laterally offset zones of the image element array, each zone of the plurality of laterally offset zones having an area at least as large as an area occupied by a magnified microimage of the magnified version of the array of microimages, and the plurality of laterally offset zones being configured such that (i) at a first viewing angle, optical characteristics of the magnified microimage of the magnified version of the array of microimages are determined by a first set of one or more zones of the colour layer, and (ii) at a second viewing angle, the optical characteristics of the same magnified microimage are determined by a different, second set of the one or more zones of the colour layer such that the optical characteristics of the magnified microimage change between the first viewing angle and the second viewing angle.

2. The security device according to claim 1, wherein:
    the first set of the one or more zones of the plurality of laterally offset zones includes a single zone of the colour layer such that at the first viewing angle, the entire magnified microimage is displayed with the same optical characteristics corresponding to optical characteristics of the single zone, and
    the second set of the one or more zones of the plurality of laterally offset zones includes at least two zones of the colour layer such that at the second viewing angle, at least two parts of the magnified microimage are displayed with respectively different optical characteristics corresponding to optical characteristics of the at least two zones of the colour layer.

3. The security device according to claim 1, wherein an angular separation between the first viewing angle and the second viewing angle has a maximum value of 50 degrees.

4. The security device according to claim 1, wherein at least two zones of the plurality of laterally offset zones of the colour layer have an area less than an area occupied by two adjacent magnified microimages of the magnified version of the array of microimages in at least one dimension.

5. The security device according to claim 1, wherein the plurality of laterally offset zones of the colour layer have a periodicity equal to a periodicity of the magnified array of microimages.

6. The security device according to claim 1, wherein the colour layer is an image formed of an arrangement of the plurality of laterally offset zones or a shape of a periphery of the plurality of laterally offset zones, the image including indicia of one or more letters, numbers, logos, or symbols.

7. The security device according to claim 1, wherein the plurality of different optically detectable materials include any of:
- visibly coloured dyes or pigments;
- luminescent, phosphorescent, or fluorescent substances which emit in a visible or non-visible spectrum;
- metallic pigments;
- interference layer structures, and
- interference layer pigments.

8. The security device according to claim 1, wherein adjacent zones of the plurality of laterally offset zones of the colour layer have different visible colours from one another.

9. The security device according to claim 1, wherein the colour layer includes one or more zones plurality of laterally offset zones in which the colour layer is absent or transparent.

10. The security device according to claim 1, wherein the image element array includes an opaque backing layer disposed on the colour layer and across the image element array, the opaque backing layer including a metal layer.

11. The security device according to claim 10, wherein the opaque backing layer extends beyond the plurality of laterally offset zones of the image element array covered by the colour layer.

12. The security device according to claim 1, wherein the patterned layer of opaque material includes a filter layer disposed between the metal layer and the transparent substrate.

13. The security device according to claim 1, wherein:
the surface of the transparent substrate defines an optically variable effect generating relief structure, the patterned metal layer conforming to contours of the relief structure on at least one side of the patterned metal layer, and
the optically variable effect generating relief structure is a diffractive relief structure.

14. The security device according to claim 1, wherein the focusing element array includes focusing elements configured to focus light in at least one direction.

15. The security device according to claim 1, wherein the focusing element array includes a plurality of lenses or a plurality of mirrors.

16. The security device according to claim 1, wherein the focusing element array has a one- or a two-dimensional periodicity in a range 5-200 microns.

17. A security article comprising the security device according to claim 1, wherein the security article is a security thread, a strip, a foil, an insert, a transfer element, a label, or a patch.

18. A security document comprising the security device according to claim 1, wherein the security document is a banknote, a cheque, a passport, an identity card, a driver's licence, a certificate of authenticity, a fiscal stamp, or other document for securing value or personal identity.

* * * * *